United States Patent
Liu et al.

(10) Patent No.: US 12,369,477 B2
(45) Date of Patent: Jul. 22, 2025

(54) PIXEL ARRANGEMENT STRUCTURE, DISPLAY SUBSTRATE, AND DISPLAY DEVICE

(71) Applicant: BOE TECHNOLOGY GROUP CO., LTD., Beijing (CN)

(72) Inventors: Libin Liu, Beijing (CN); Qian Yang, Beijing (CN); Hongli Wang, Beijing (CN); Lujiang Huangfu, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/621,904

(22) PCT Filed: Dec. 28, 2018

(86) PCT No.: PCT/CN2018/124884
§ 371 (c)(1),
(2) Date: Dec. 12, 2019

(87) PCT Pub. No.: WO2019/153949
PCT Pub. Date: Aug. 15, 2019

(65) Prior Publication Data
US 2020/0119107 A1    Apr. 16, 2020

(30) Foreign Application Priority Data
Feb. 9, 2018 (CN) .......................... 201810137016.5

(51) Int. Cl.
*H10K 59/35* (2023.01)
(52) U.S. Cl.
CPC ......... *H10K 59/353* (2023.02); *H10K 59/351* (2023.02)

(58) Field of Classification Search
CPC ............. H01L 27/3213; H01L 27/3216; H01L 27/3218; G02F 1/1333; G09G 2300/0452;
(Continued)

(56) References Cited

U.S. PATENT DOCUMENTS

| 4,491,863 A | 1/1985 | Kurahashi |
| 4,652,912 A | 3/1987 | Masubuchi |

(Continued)

FOREIGN PATENT DOCUMENTS

| CN | 101192382 A | 6/2008 |
| CN | 101339729 B | 6/2010 |

(Continued)

OTHER PUBLICATIONS

Translation of Written Opinion for PCT/CN2018/124884 (Year: 2019).*

(Continued)

*Primary Examiner* — Mary A Wilczewski
(74) *Attorney, Agent, or Firm* — Collard & Roe, P.C.

(57) ABSTRACT

A pixel arrangement structure, a display substrate, and a display device. The pixel arrangement structure includes a plurality of pixel sets; each pixel set comprises a first sub-pixel, a second sub-pixel, a third sub-pixel, and a fourth sub-pixel; in the pixel set, a line connecting the center of the second sub-pixel and the center of the third sub-pixel is a first line segment; the first sub-pixel and the fourth sub-pixel are located between the second sub-pixel and the third sub-pixel and are respectively disposed at two sides of the first line segment; a line connecting the center of the first sub-pixel and the center of the fourth sub-pixel is a second line segment, and the length of the second line segment is shorter than the length of the first line segment.

16 Claims, 9 Drawing Sheets

(58) Field of Classification Search
CPC .. G09G 3/3607; H10K 59/351; H10K 59/352; H10K 59/353
See application file for complete search history.

(56) References Cited

U.S. PATENT DOCUMENTS

| | | | |
|---|---|---|---|
| 5,113,274 A | 5/1992 | Takahashi et al. | |
| 5,341,153 A | 8/1994 | Benzschawel et al. | |
| 6,768,482 B2 | 7/2004 | Asano et al. | |
| 6,950,115 B2 | 9/2005 | Brown Elliott | |
| 7,123,277 B2 | 10/2006 | Brown Elliott et al. | |
| 7,525,526 B2 | 4/2009 | Brown Elliott et al. | |
| 7,663,299 B2 | 2/2010 | Chao et al. | |
| 7,733,359 B1 | 6/2010 | Hagge et al. | |
| 8,159,508 B2 | 4/2012 | Lee | |
| 8,330,352 B2 | 12/2012 | Sung et al. | |
| 8,363,072 B2 | 1/2013 | Hong et al. | |
| 8,446,435 B2 | 5/2013 | Tomizawa et al. | |
| 8,754,913 B2 | 6/2014 | Hwang et al. | |
| 8,994,015 B2 | 3/2015 | Pyon et al. | |
| 9,337,241 B2 | 5/2016 | Lee et al. | |
| 9,343,511 B1 | 5/2016 | Feng | |
| 9,424,771 B2 | 8/2016 | Gong | |
| 9,472,600 B2 | 10/2016 | Lin et al. | |
| 9,570,706 B2 | 2/2017 | Yim et al. | |
| 9,647,039 B1 | 5/2017 | Wang et al. | |
| 9,704,926 B2 | 7/2017 | Kim | |
| 9,734,753 B2 | 8/2017 | Li et al. | |
| 9,818,803 B2 | 11/2017 | Lee | |
| 9,871,085 B2 | 1/2018 | Cho et al. | |
| 9,905,604 B2 | 2/2018 | Murata | |
| 9,946,123 B2 | 4/2018 | Huangfu et al. | |
| 9,984,624 B2 | 5/2018 | Takahashi et al. | |
| 10,026,785 B2 | 7/2018 | Bai et al. | |
| 10,068,541 B2 | 9/2018 | Sakaigawa | |
| 10,181,499 B2* | 1/2019 | Jo | G09G 3/3225 |
| 10,210,787 B2 | 2/2019 | Jin | |
| 10,274,654 B2* | 4/2019 | Jin | G02F 1/134309 |
| 10,283,086 B1 | 5/2019 | Su et al. | |
| 10,373,541 B2 | 8/2019 | Lee et al. | |
| 10,504,483 B2 | 12/2019 | Chen et al. | |
| 10,520,775 B2 | 12/2019 | You et al. | |
| 10,565,918 B2 | 2/2020 | Wu et al. | |
| 10,579,173 B2 | 3/2020 | Xu et al. | |
| 10,629,656 B2 | 4/2020 | Jo et al. | |
| 10,699,642 B2 | 6/2020 | Ma et al. | |
| 10,854,684 B2* | 12/2020 | Huangfu | H01L 27/3218 |
| 10,861,905 B2 | 12/2020 | Wang | |
| 10,867,545 B2 | 12/2020 | Kirisken | |
| 10,909,901 B2* | 2/2021 | Wu | H01L 27/3216 |
| 10,943,955 B2* | 3/2021 | Wang | H01L 27/3216 |
| 11,069,286 B2* | 7/2021 | Tan | G09G 3/3208 |
| 11,232,750 B2 | 1/2022 | Wang et al. | |
| 11,233,096 B2* | 1/2022 | Huangfu | G02F 1/134345 |
| 11,238,816 B2* | 2/2022 | Huangfu | G09G 3/36 |
| 11,264,430 B2* | 3/2022 | Huangfu | G09G 3/3233 |
| 2005/0018110 A1 | 1/2005 | Liu | |
| 2005/0041188 A1 | 2/2005 | Yamazaki | |
| 2007/0205423 A1 | 9/2007 | Yamazaki et al. | |
| 2007/0290973 A1 | 12/2007 | Wei | |
| 2008/0001525 A1 | 1/2008 | Chao et al. | |
| 2008/0224968 A1 | 9/2008 | Kashiwabara | |
| 2008/0231554 A1 | 9/2008 | Lee | |
| 2009/0051638 A1 | 2/2009 | Horiuchi et al. | |
| 2009/0079351 A1 | 3/2009 | Choi et al. | |
| 2009/0121983 A1 | 5/2009 | Sung et al. | |
| 2009/0153044 A1 | 6/2009 | Yanagihara | |
| 2009/0302331 A1 | 12/2009 | Smith et al. | |
| 2010/0033084 A1 | 2/2010 | Ko et al. | |
| 2010/0289732 A1 | 11/2010 | Ina et al. | |
| 2011/0025723 A1 | 2/2011 | Kim | |
| 2011/0127506 A1 | 6/2011 | So | |
| 2011/0128262 A1 | 6/2011 | Chaji et al. | |
| 2011/0234550 A1 | 9/2011 | Hong et al. | |
| 2011/0260951 A1 | 10/2011 | Hwang et al. | |
| 2011/0260952 A1 | 10/2011 | Hwang et al. | |
| 2011/0291549 A1 | 12/2011 | Kim et al. | |
| 2011/0291550 A1 | 12/2011 | Kim et al. | |
| 2012/0025182 A1 | 2/2012 | Umeda et al. | |
| 2012/0039034 A1 | 2/2012 | Jepsen et al. | |
| 2012/0092238 A1 | 4/2012 | Hwang et al. | |
| 2012/0313844 A1 | 12/2012 | Im et al. | |
| 2013/0234917 A1 | 9/2013 | Lee | |
| 2014/0003045 A1 | 1/2014 | Lee et al. | |
| 2014/0071030 A1 | 3/2014 | Lee | |
| 2014/0145586 A1 | 5/2014 | Choi | |
| 2014/0198479 A1 | 7/2014 | Chao et al. | |
| 2014/0220715 A1 | 8/2014 | Kang | |
| 2014/0226323 A1 | 8/2014 | Huang et al. | |
| 2014/0252321 A1 | 9/2014 | Pyon et al. | |
| 2014/0284570 A1 | 9/2014 | Jinta et al. | |
| 2014/0292622 A1 | 10/2014 | Lee | |
| 2014/0346537 A1 | 11/2014 | Xi | |
| 2015/0008820 A1 | 1/2015 | Lee | |
| 2015/0015465 A1 | 1/2015 | Gong | |
| 2015/0021637 A1 | 1/2015 | Ahn et al. | |
| 2015/0102320 A1 | 4/2015 | Jung | |
| 2015/0162391 A1 | 6/2015 | Kim | |
| 2015/0162394 A1 | 6/2015 | Tokuda et al. | |
| 2015/0200237 A1 | 7/2015 | Yim et al. | |
| 2015/0270317 A1 | 9/2015 | Lee et al. | |
| 2015/0311264 A1 | 10/2015 | Shen et al. | |
| 2015/0311265 A1 | 10/2015 | Matsueda et al. | |
| 2015/0350583 A1 | 12/2015 | Mauritzson et al. | |
| 2015/0379916 A1 | 12/2015 | Guo et al. | |
| 2016/0013251 A1 | 1/2016 | Yoshida et al. | |
| 2016/0019825 A1 | 1/2016 | Guo et al. | |
| 2016/0049438 A1 | 2/2016 | Murata | |
| 2016/0078807 A1* | 3/2016 | Sun | G09G 3/3233 345/204 |
| 2016/0104413 A1 | 4/2016 | Matsueda et al. | |
| 2016/0126295 A1 | 5/2016 | Sato | |
| 2016/0126296 A1 | 5/2016 | Feng | |
| 2016/0126298 A1* | 5/2016 | Chen | H10K 59/353 257/40 |
| 2016/0133181 A1 | 5/2016 | Nakamura | |
| 2016/0155781 A1 | 6/2016 | Chaji | |
| 2016/0163247 A1 | 6/2016 | Lee et al. | |
| 2016/0171918 A1 | 6/2016 | Kim et al. | |
| 2016/0190523 A1 | 6/2016 | Kim et al. | |
| 2016/0196776 A1 | 7/2016 | Yang et al. | |
| 2016/0203748 A1 | 7/2016 | Matsueda et al. | |
| 2016/0240593 A1 | 8/2016 | Gu et al. | |
| 2016/0253943 A1 | 9/2016 | Wang | |
| 2016/0254476 A1 | 9/2016 | Park | |
| 2016/0293678 A1 | 10/2016 | Wang | |
| 2016/0300892 A1 | 10/2016 | Bai et al. | |
| 2016/0343284 A1 | 11/2016 | Sun | |
| 2016/0351119 A1 | 12/2016 | Ono | |
| 2016/0357076 A1 | 12/2016 | Huangfu et al. | |
| 2016/0358536 A1 | 12/2016 | Li et al. | |
| 2016/0358985 A1 | 12/2016 | Bai et al. | |
| 2016/0370919 A1 | 12/2016 | Xu et al. | |
| 2017/0039924 A1 | 2/2017 | Jin | |
| 2017/0133440 A1 | 5/2017 | Wang et al. | |
| 2017/0179389 A1 | 6/2017 | Cho et al. | |
| 2017/0193880 A1 | 7/2017 | Lee et al. | |
| 2017/0294491 A1 | 10/2017 | Jo et al. | |
| 2017/0317150 A1 | 11/2017 | Chung et al. | |
| 2017/0352710 A1 | 12/2017 | Hong et al. | |
| 2018/0012547 A1 | 1/2018 | Li et al. | |
| 2018/0088260 A1* | 3/2018 | Jin | H01L 27/3218 |
| 2018/0090549 A1 | 3/2018 | Hamada et al. | |
| 2018/0097043 A1 | 4/2018 | Song | |
| 2018/0175121 A1 | 6/2018 | Ji et al. | |
| 2018/0247984 A1 | 8/2018 | Wang et al. | |
| 2018/0308412 A1 | 10/2018 | Wu et al. | |
| 2018/0308907 A1 | 10/2018 | Jin et al. | |
| 2018/0342570 A1 | 11/2018 | Hong et al. | |
| 2018/0355466 A1 | 12/2018 | Mu | |
| 2019/0011830 A1 | 1/2019 | Ji | |
| 2019/0035859 A1 | 1/2019 | Kang et al. | |
| 2019/0066564 A1 | 2/2019 | Tan | |
| 2019/0088726 A1 | 3/2019 | Zhang | |

(56) References Cited

U.S. PATENT DOCUMENTS

| | | | |
|---|---|---|---|
| 2019/0096962 A1 | 3/2019 | Han et al. | |
| 2019/0131589 A1 | 5/2019 | Matsueda et al. | |
| 2019/0139513 A1 | 5/2019 | Su et al. | |
| 2019/0140030 A1* | 5/2019 | Huangfu | G09G 3/3225 |
| 2019/0206341 A1 | 7/2019 | Liao et al. | |
| 2019/0237518 A1 | 8/2019 | Sun et al. | |
| 2019/0296093 A1 | 9/2019 | Liu et al. | |
| 2019/0326365 A1 | 10/2019 | Jin | |
| 2019/0333970 A1 | 10/2019 | Lee | |
| 2019/0340970 A1 | 11/2019 | Kirisken | |
| 2020/0013833 A1* | 1/2020 | Wang | H01L 27/3216 |
| 2020/0035172 A1 | 1/2020 | Chen | |
| 2020/0043990 A1* | 2/2020 | Huangfu | G09G 3/3233 |
| 2020/0119107 A1* | 4/2020 | Liu | H01L 27/3213 |
| 2020/0258441 A1 | 8/2020 | Zhang et al. | |
| 2020/0271968 A1 | 8/2020 | Ju | |
| 2020/0328259 A1 | 10/2020 | Joe | |
| 2020/0365085 A1 | 11/2020 | Yang et al. | |
| 2021/0091145 A1* | 3/2021 | Huangfu | H01L 27/3218 |
| 2021/0335297 A1 | 10/2021 | Huangfu et al. | |
| 2022/0028348 A1 | 1/2022 | Huangfu et al. | |

FOREIGN PATENT DOCUMENTS

| | | | |
|---|---|---|---|
| CN | 102201430 A | 9/2011 | |
| CN | 101582241 B | 10/2011 | |
| CN | 103681754 A | 3/2014 | |
| CN | 103777393 A | 5/2014 | |
| CN | 104037202 A | 9/2014 | |
| CN | 104051493 A | 9/2014 | |
| CN | 104269411 A | 1/2015 | |
| CN | 104282727 A | 1/2015 | |
| CN | 104332486 A | 2/2015 | |
| CN | 104362170 A | 2/2015 | |
| CN | 104377229 A | 2/2015 | |
| CN | 104465714 A | 3/2015 | |
| CN | 104576695 A | 4/2015 | |
| CN | 104597655 A | 5/2015 | |
| CN | 104637987 A | 5/2015 | |
| CN | 104701341 A | 6/2015 | |
| CN | 104795431 A | 7/2015 | |
| CN | 104835832 A | 8/2015 | |
| CN | 104882464 A | 9/2015 | |
| CN | 105280139 A | 1/2016 | |
| CN | 204991022 U | 1/2016 | |
| CN | 204991023 U | 1/2016 | |
| CN | 205231065 U | 5/2016 | |
| CN | 205355055 U | 6/2016 | |
| CN | 105789253 A | 7/2016 | |
| CN | 105826349 A | 8/2016 | |
| CN | 105938266 A | 9/2016 | |
| CN | 105976757 A | 9/2016 | |
| CN | 205608350 U | 9/2016 | |
| CN | 205845956 U | 12/2016 | |
| CN | 106293244 A | 1/2017 | |
| CN | 106298865 A | 1/2017 | |
| CN | 106601167 A | 4/2017 | |
| CN | 106782307 A | 5/2017 | |
| CN | 206163494 U | 5/2017 | |
| CN | 104597655 B | 6/2017 | |
| CN | 106935618 A | 7/2017 | |
| CN | 106935630 A | 7/2017 | |
| CN | 107248378 A | 10/2017 | |
| CN | 107256695 A | 10/2017 | |
| CN | 107275359 A | 10/2017 | |
| CN | 107393468 A | 11/2017 | |
| CN | 107481671 A | 12/2017 | |
| CN | 107644888 A | 1/2018 | |
| CN | 107665684 A | 2/2018 | |
| CN | 107817632 A | 3/2018 | |
| CN | 107910348 A | 4/2018 | |
| CN | 207781607 U | 8/2018 | |
| CN | 207781608 U | 8/2018 | |
| CN | 207883217 U | 9/2018 | |
| CN | 208172438 U | 11/2018 | |
| CN | 208172439 U | 11/2018 | |
| CN | 109491158 A | 3/2019 | |
| CN | 109559679 A | 4/2019 | |
| CN | 109891487 A | 6/2019 | |
| CN | 110010021 A | 7/2019 | |
| EP | 2 423 911 A2 | 2/2012 | |
| EP | 2 680 310 A1 | 1/2014 | |
| EP | 2 709 155 A1 | 3/2014 | |
| EP | 3 751 611 A1 * | 12/2020 | H01L 27/3216 |
| JP | H0945266 A | 2/1997 | |
| JP | 2002-221917 A | 8/2002 | |
| JP | 2005062416 A | 3/2005 | |
| JP | 2005-091875 A | 4/2005 | |
| JP | 2008-015521 A | 1/2008 | |
| JP | 2008-197491 A | 8/2008 | |
| JP | 2008225179 A | 9/2008 | |
| JP | 2009533810 A | 9/2009 | |
| JP | 2014056819 A | 3/2014 | |
| JP | 2014225329 A | 12/2014 | |
| JP | 2015138955 A | 7/2015 | |
| JP | 2016-090991 A | 5/2016 | |
| JP | 2016075868 A | 5/2016 | |
| JP | 2016091918 A | 5/2016 | |
| JP | 2016130780 A | 7/2016 | |
| JP | 2016537688 A | 12/2016 | |
| JP | 2018503849 A | 2/2018 | |
| JP | 2018198198 A | 12/2018 | |
| KR | 10-2009-0049515 A | 5/2009 | |
| KR | 10-2011-0108050 A | 10/2011 | |
| KR | 10-2013-0101874 A | 9/2013 | |
| KR | 10-1347995 B1 | 1/2014 | |
| KR | 10-2015-0006668 A | 1/2015 | |
| KR | 10-2016-0051511 A | 5/2016 | |
| KR | 10-2017-0116556 A | 10/2017 | |
| RU | 2 453 879 C2 | 6/2012 | |
| WO | 2007/088656 A1 | 8/2007 | |
| WO | 2014/136149 A1 | 9/2014 | |
| WO | 2016192241 A1 | 12/2016 | |
| WO | 2017/140038 A1 | 8/2017 | |
| WO | WO 2017/140038 * | 8/2017 | H01L 27/32 |
| WO | 2018014562 A1 | 1/2018 | |
| WO | WO 2019/084932 * | 5/2019 | H01L 27/32 |
| WO | WO 2019/134514 * | 7/2019 | H01L 27/32 |
| WO | WO 2019/134522 * | 7/2019 | H01L 21/77 |
| WO | WO 2019/153948 * | 8/2019 | H01L 27/3216 |
| WO | WO 2019/153949 * | 8/2019 | H01L 27/32 |
| WO | WO 2020/124693 * | 6/2020 | H01L 27/32 |

OTHER PUBLICATIONS

Translation of Search Report for PCT/CN2018/124884 (Year: 2019).*
International Search Report of PCT/CN2018/124884 in Chinese, mailed Mar. 27, 2019, with English translation.
International Search Report of PCT/CN2016/081097 in Chinese, mailed Nov. 16, 2016, with English translation.
International Preliminary Report on Patentability of PCT/CN2016/081097, issuance date Aug. 21, 2018 and Written Opinion of the International Searching Authority of PCT/CN2016/081097 in Chinese, mailed Nov. 16, 2016 with English translation.
First Office Action in U.S. Appl. No. 15/536,347 dated Aug. 28, 2018.
English translation of Extended European Search Report in EP Application No. 16890271.6 mailed Sep. 25, 2019.
Chinese Office Action in Chinese Application No. 201810135947.1, mailed Mar. 3, 2020 with English translation.
Indian Office Action in Indian Application No. 201717038562, mailed Oct. 15, 2019.
English translation of Extended European Search Report in EP Application No. 17768339.8 mailed Dec. 6, 2019.
English translation of the International Search Report of PCT/CN2017/075957, mailed Jun. 8, 2017.
International Preliminary Report on Patentability of PCT/CN2017/075957, issuance date Jan. 22, 2019 and English Translation of the Written Opinion of the International Searching Authority of PCT/CN2017/075957, mailed Jun. 8, 2017.
Korean Office Action in Korean Application No. 10-2017-7022698, mailed May 29, 2019 with English translation.

(56) References Cited

OTHER PUBLICATIONS

Korean Notice of Allowance in Korean Application No. 10-2017-7022698, mailed Mar. 6, 2020.
First Office Action in U.S. Appl. No. 15/578,481 dated Feb. 1, 2019.
International Search Report of PCT/CN2018/124890 in Chinese, mailed Mar. 27, 2019, with English translation.
Russian Search Report in Russian Application No. 2019130488, mailed Jan. 16, 2020, with English translation.
International Search Report of PCT/CN2018/124881 in Chinese, mailed Mar. 26, 2019, with English translation.
International Search Report of PCT/CN2018/124386 in Chinese, mailed Mar. 29, 2019, with English translation.
International Search Report of PCT/CN2018/124445 in Chinese, mailed Mar. 21, 2019, with English translation.
International Search Report of PCT/CN2018/124404 in Chinese, mailed Mar. 14, 2019, with English translation.
Notice of Allowance in U.S. Appl. No. 16/630,496 dated Mar. 26, 2021.
Notice of Allowance in U.S. Appl. No. 16/600,316 dated Apr. 14, 2021.
Extended European Search Report in European Patent Application EP21152119.0 dated May 11, 2021.
Indian Office Action in Indian Application No. 202017026082 dated May 25, 2021.
Candice H. Brown Elliot, "Reducing Pixel Count Without Reducing Image Quality", Information display, vol. 1999 (12): 22-25, 1999 (4 pages).
Lu Fang et al., "Subpixel Rendering: From Font Rendering to Image Subsampling", IEEE Signal Processing Magazine, vol. 2013 (5): 177-182 and 189, 2013 (7 pages).
Dean S. Messing, Scott Daly, "Improved Display Resolution of Subsampled Colour Images Using Subpixel Addressing", IEEE ICIP 2002: I-625-628, 2002 (4 pages).
Huang et al., "RGB to RGBG conversion algorithm based on weighting factors and related FPGA realization", China Academic Journal Electronic Publishing House, vol. 32, No. 7, Jul. 2017, pp. 572-579 (8 pages).
First Office Action in U.S. Appl. No. 16/492,930 dated Jul. 24, 2020.
Korean Office Action in Korean Application No. 10-2019-7024785, mailed Jul. 30, 2020 with English translation.
Notice of Allowance in U.S. Appl. No. 16/234,777 dated Sep. 1, 2020.
First Office Action in U.S. Appl. No. 16/600,316 dated Oct. 6, 2020.
Non-Final Office Action in U.S. Appl. No. 15/578,481 dated Jul. 11, 2019.
First Office Action in U.S. Appl. No. 16/621,918 dated Sep. 29, 2020.
Japanese Office Action in Japanese Application No. 2017-544608, mailed Oct. 12, 2020 with English translation.
Korean Office Action in Korean Application No. 10-2019-7027773, mailed Dec. 25, 2020 with English translation.
Indian Office Action in Indian Application No. 202017026082 dated May 25, 2021 with English translation.
Park et al., Luminance Uniformity of Large-Area OLEDs With an Auxiliary Metal Electrode, Journal of Display Technology, Downloaded on Jun. 2, 2021 from IEEE Xplore, Aug. 2009, pp. 306-311, vol. 5, No. 8.
U.S. Office Action in U.S. Appl. No. 16/483,210 dated Sep. 22, 2021.
Written Decision of Dismissal of Amendment in Korean Application No. 10-2019-7027773 dated Aug. 24, 2021 with English translation.
Extended European Search Report in European Application No. 18905693.0 dated Oct. 1, 2021.
Indian Office Action in Indian Application No. 202017027785 dated Aug. 19, 2021 with English translation.
Extended European Search Report in European Application No. 18905189.9 dated Oct. 19, 2021.
1 U.S. Final Office Action in U.S. Appl. No. 17/170,457 dated Nov. 16, 2021.
U.S. Office Action in U.S. Appl. No. 16/622,045 dated Dec. 21, 2021.
Extended European Search Report in European Application No. 18903035.6 dated Nov. 8, 2021.
Indian Office Action in Indian Application No. 202027048001 dated Dec. 6, 2021 with English translation.
Korean Office Action in Korean Application No. 2021-7030323 dated Jan. 25, 2022 with English translation.
First Chinese Office Action in Chinese Application No. 201680082630.5 dated Apr. 1, 2022 with English translation.
First Australian Office Action in Australian Application No. 2021203983 dated May 12, 2022.
U.S. Notice of Allowance in U.S. Appl. No. 16/755,970 dated May 6, 2022.
U.S. Office Action in U.S. Appl. No. 17/497,630 dated May 12, 2022.
Extended European Search Report in European Application No. 19933238.8 dated Oct. 18, 2022.
Extended European Search Report in European Application No. 19832268.7 dated Oct. 25, 2022.
Japanese Office Action in Japanese Application No. 2020-536078 dated Nov. 28, 2022.
Japanese Office Action in Japanese Application No. 2019-549456 dated Nov. 29, 2022.
Japanese Office Action in Japanese Application No. 2019-543028 dated Nov. 29, 2022.
Japanese Office Action in Japanese Application No. 2020535989 dated Jan. 4, 2023.
Extended European Search Report in European Application No. 19933217.2 dated Jul. 5, 2022.
Japanese Office Action in Japanese Application No. 2019-569438 dated Mar. 27, 2023 with English translation.
Chinese Office Action in Chinese Application No. 201810137016.5 dated Nov. 30, 2023 with English translation.
European Office Action in European Application No. 18903035.6 dated Nov. 16, 2023.
Chinese Office Action in Chinese Application No. 201810136335.4 dated Nov. 15, 2023 with English translation.
Chinese Office Action in Chinese Application No. 201810137012.7 dated Nov. 30, 2023 with English translation.
U.S. Final Office Action in U.S. Appl. No. 16/957,607 dated Apr. 16, 2024.
U.S. Office Action in U.S. Appl. No. 16/957,607 dated Dec. 29, 2023.
U.S. Office Action in U.S. Appl. No. 18/140,699 dated Sep. 11, 2023.
U.S. Office Action in U.S. Appl. No. 17/551,341 dated Sep. 27, 2023.
U.S. Office Action in U.S. Appl. No. 17/551,341 dated Jul. 14, 2023.
U.S. Office Action in U.S. Appl. No. 16/957,607 dated Aug. 13, 2024.
Japanese Office Action in Japanese Patent Application No. 2023-158357 dated Aug. 5, 2024 with English translation.
U.S. Non-Final Office Action in U.S. Appl. No. 17/853,989 mailed Jun. 13, 2025.

\* cited by examiner

PIXEL ARRANGEMENT STRUCTURE, DISPLAY SUBSTRATE, AND DISPLAY DEVICE

CROSS REFERENCE TO RELATED APPLICATIONS

This application is the National Stage of PCT/CN2018/124884 filed on Dec. 28, 2018, which claims priority under 35 U.S.C. § 119 of Chinese Application No. 201810137016.5 filed on Feb. 9, 2018, the disclosure of which is incorporated by reference.

TECHNICAL FIELD

Embodiments of the present disclosure relates to a pixel arrangement structure, a display substrate and a display device.

BACKGROUND

With the continuous development of display technology, people have higher and higher requirements for the resolution of display devices. Due to the advantages of high display quality, the application range of high-resolution display devices is becoming wider and wider. In general, the resolution of a display device can be improved by reducing the size of pixels and reducing the spacing between pixels. However, the reduction in the size of pixels and the spacing between pixels also requires higher and higher precision of the manufacturing process, which leads to the increase in the difficulty of the manufacturing process and the manufacturing cost of the display device.

On the other hand, sub-pixel rendering (SPR) technology can make use of the difference of human eyes' resolution to sub-pixels of different colors, change the mode of defining a pixel simply by conventional red, green and blue sub-pixels, share sub-pixels of certain position resolution insensitive colors among different pixels, and use relatively few sub-pixels to simulate and realize the same pixel resolution performance capability, thus reducing the difficulty of the manufacturing process and the manufacturing cost.

SUMMARY

Embodiments of the present disclosure provide a pixel arrangement structure, a display substrate and a display device. The pixel arrangement structure can improve the distribution uniformity of sensitive color sub-pixels by adjusting the spacing of sensitive color sub-pixels, thereby improving the visual resolution of the pixel arrangement structure and also improving the display quality of the pixel arrangement structure.

At least one embodiment of the present disclosure provides a pixel arrangement structure, including a plurality of pixel groups; each of the plurality of pixel groups includes a first sub-pixel, a second sub-pixel, a third sub-pixel and a fourth sub-pixel; in each of the plurality of pixel groups, a connection line between a center of the second sub-pixel and a center of the third sub-pixel is a first line segment, the first sub-pixel and the fourth sub-pixel are between the second sub-pixel and the third sub-pixel and are respectively at two sides of the first line segment; a connection line between a center of the first sub-pixel and a center of the fourth sub-pixel is a second line segment; a length of the second line segment is less than a length of the first line segment.

For example, a ratio of the length the second line segment to the length the first line segment is less than or equal to 3/4.

For example, the second line segment and the first line segment are vertically bisected to each other.

For example, the ratio of the length of the second line segment to the length of the first line segment is greater than or equal to 3/8.

For example, in each of the plurality of pixel groups, the first sub-pixel and the fourth sub-pixel are both strip-shaped, and an extension direction of the first sub-pixel and an extension direction of the fourth sub-pixel do not coincide.

For example, an included angle between the extension direction of the first sub-pixel and the extension direction of the fourth sub-pixel ranges from 70° to 100°.

For example, the first sub-pixel and the fourth sub-pixel are symmetrically arranged relative to the first line segment, and/or the second sub-pixel and the third sub-pixel are symmetrically arranged relative to the second line segment.

For example, the first line segment extends in the first direction and the second line segment extends in a second direction; the plurality of pixel groups are arranged in an array to form a plurality of rows and a plurality of columns, and pixel groups of even rows and pixel groups of odd rows are arranged in a staggered way; a length of a center connection line between the second sub-pixel and the third sub-pixel that are adjacent to each other in two adjacent ones of the plurality of pixel groups in the first direction is less than the length of the first line segment; in two adjacent ones of the odd rows or in two adjacent ones of the even rows, a length of a center connection line between the first sub-pixel and the fourth sub-pixel that are adjacent to each other in two adjacent ones of the plurality of pixel groups in the second direction is greater than the length of the second line segment.

For example, a ratio of the length of the center connection line between the second sub-pixel and the third sub-pixel that are adjacent to each other in two adjacent ones of the plurality of pixel groups in the first direction to the length of the first line segment is less than or equal to 1/2; and/or, in two adjacent ones of the odd rows or in two adjacent ones of the even rows, a ratio of the length of the center connection line between the first sub-pixel and the fourth sub-pixel that are adjacent to each other in two adjacent ones of the plurality of pixel groups in the second direction to the length of the second line segment ranges from 1 to 3.

For example, an extension line of the second line segment of each of the plurality of pixel groups passes through a midpoint of a center connection line between two pixel groups that are adjacent to the pixel group in the second direction and are in a same row with the pixel group.

For example, in two adjacent ones of the odd rows or in two adjacent ones of the even rows, an intersection point of a center connection line between two third sub-pixels in two adjacent ones of the plurality of pixel groups arranged in the second direction and the first line segment in one pixel group between the two third sub-pixels is between a center of the first line segment and the center of the second sub-pixel of the one pixel group.

For example, in the same one of the plurality of pixel groups, the closest distance between the second sub-pixel and the first sub-pixel is L1, the closest distance between the second sub-pixel and the fourth sub-pixel is L2, the closest distance between the third sub-pixel and the first sub-pixel is L3, the closest distance between the third sub-pixel and the fourth sub-pixel is L4, and L1=L2=L3=L4.

For example, the closest distance between the second sub-pixel and one of the first sub-pixel and the fourth sub-pixel is L5, the closet distance between the third sub-pixel and one of the first sub-pixel and the fourth sub-pixel is L6, the second sub-pixel and the third sub-pixel are in a pixel group being adjacent to the first sub-pixel or the fourth sub-pixel in the second direction and am not in the same row with the first sub-pixel or the fourth sub-pixel, and L5=L6.

For example, opposite of two adjacent sub-pixels sides are approximately parallel or have an included angle less than 45 degrees, and the adjacent sub-pixels include any two adjacent ones selected from the group consisting of the first sub-pixel, the second sub-pixel, the third sub-pixel, and the fourth sub-pixel.

For example, the first sub-pixel and the fourth sub-pixel are sub-pixels of the same color.

At least one embodiment of the present disclosure provides a display substrate, including the pixel arrangement structure according to at least one embodiment of the present disclosure.

At least one embodiment of the present disclosure provides a display device, including the display substrate according to at least one embodiment of the present disclosure.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

Figure 1:
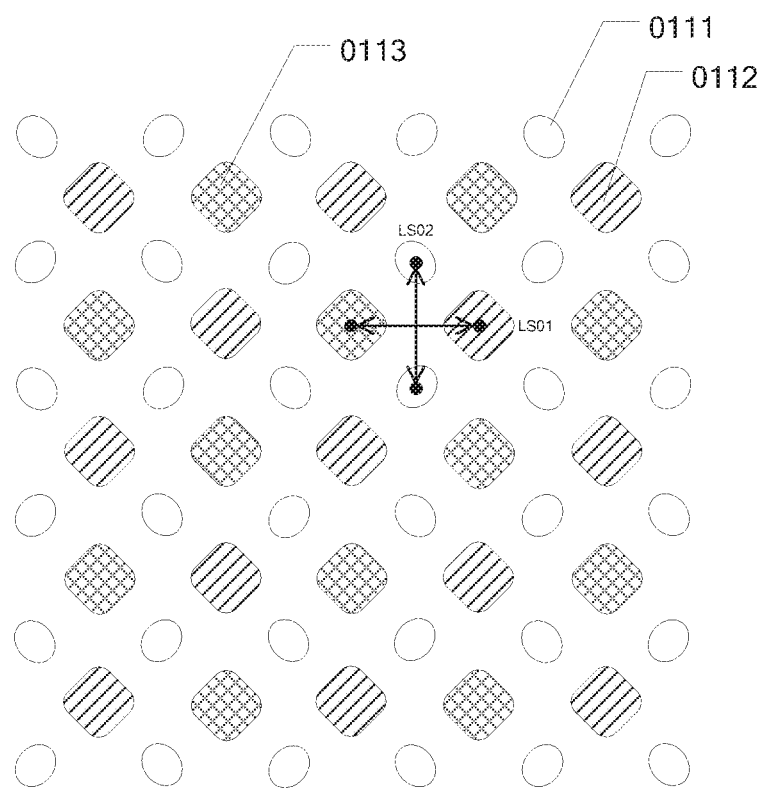
FIG. 1 is a schematic diagram of a pixel arrangement structure.

FIG. 1 illustrates a schematic diagram of a pixel arrangement structure. As illustrated in FIG. 1, the pixel arrangement structure is a typical pentile arrangement. A minimum repeating unit includes two green sub-pixels 0111, a red sub-pixel 0112 and a blue sub-pixel 0113. The pixels are uniformly distributed, and high pixel per inch (PPI) display is easy to realize.

The inventor(s) of the present application found that, in the pixel arrangement structure illustrated in FIG. 1, the distance between the two green sub-pixels 0111 in the minimum repeating unit is relatively large, which is not conducive to improving visual resolution and is easy to appear color edges and graininess. Generally, in the minimum repeating unit in FIG. 1, the center connection line LS02 between the two green sub-pixels 0111 is approximately the same length as the connection line LS01 of the center of the red sub-pixel 0112 and the center of the blue sub-pixel 0113 in the minimum repeating unit.

Even after SPR technology is adopted, high resolution products still need a higher PPI (pixel per inch) sub-pixel patterning process to be manufactured, thus still being restricted by the manufacturing process precision. Therefore, it is necessary to improve the pixel arrangement structure in order to reduce the manufacturing process difficulty and make high resolution products suitable for mass production.

In order to manufacture a display device with high resolution, it is needed to reduce the size of pixels and the spacing between pixels. However, the reduction in the size of pixels and the spacing between pixels also requires higher and higher precision of the manufacturing process, which will lead to the increase in the difficulty and cost of the manufacturing process of the display device. For example, when manufacturing an active matrix organic light emitting diode (AMOLED) display device with high resolution, because the limitation of process precision of fine metal mask (FMM) technology, the manufacturing process for manufacturing an AMOLED display device with high resolution (e.g., greater than 300 pixels per inch (PPI)) is difficult and costly. The advantages and disadvantages of pixel arrangement have great influence on the display effect. A good pixel arrangement can improve the display quality of the picture, increase the aperture ratio, reduce the color mixing and reduce the process difficulty.

Figure 2:
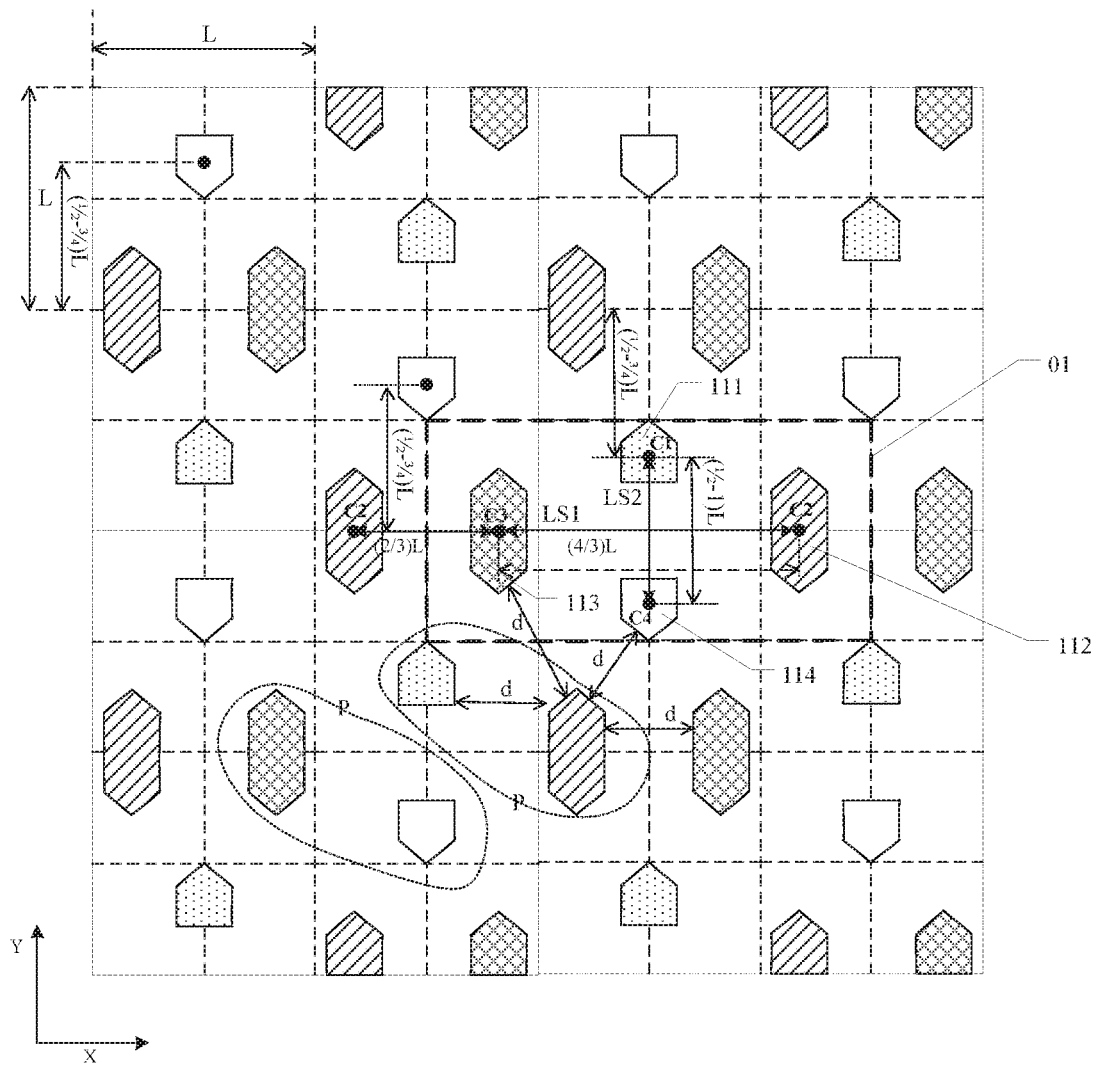
FIG. 2 is a schematic diagram of a pixel arrangement structure according to an embodiment of the present disclosure.

As illustrated in FIG. 2, at least one embodiment of the present disclosure provides a pixel arrangement structure, including a plurality of pixel groups 01. Each of the plurality of pixel groups 01 includes a first sub-pixel 111, a second sub-pixel 112, a third sub-pixel 113 and a fourth sub-pixel 114. In each of the plurality of pixel groups 01, a connection line between a center C2 of the second sub-pixel 112 and a center C3 of the third sub-pixel 113 is a first line segment LS1; the first sub-pixel 111 and the fourth sub-pixel 114 are between the second sub-pixel 112 and the third sub-pixel 113 and are respectively at two sides of the first line segment LS1. A connection line between a center C1 of the first sub-pixel 111 and a center C4 of the fourth sub-pixel 114 is a second line segment LS2. A length of the second line segment LS2 is less than a length of the first line segment LS1. For example, in order to obtain a good pixel arrangement effect, a ratio of the length the second line segment LS2 to the length the first line segment LS1 is less than or equal to 3/4.

The pixel arrangement structure provided by at least one embodiment of the present disclosure reduces the distance between the first sub-pixel and the fourth sub-pixel in the same pixel group. On the one hand, the pixel arrangement can be made tighter, the color mixing risk can be reduced, the color edge can be improved, and the visual graininess can be improved. On the other hand, the spacing between sub-pixels can be widened to facilitate fabrication. Alternatively, a balance can be found between the tightness of pixel arrangement and the spacing between sub-pixels, so that the pixel arrangement is relatively tight and the spacing between sub-pixels (pixel defining layer spacing) is widened to a certain extent, which is beneficial to reducing the risk of color mixing, improving color edges, improving the visual graininess and widening the spacing between sub-pixels.

For example, the shape of each sub-pixel given in the embodiments of the present disclosure can be defined by a pixel defining layer, but is not limited thereto. For example, each sub-pixel in the figure is an actual light emitting area. The specific shape of each sub-pixel can be set according to the preparation process. For example, the actual light emitting area can be determined by the shape of at least one of the electrode, the light emitting layer, and the pixel defining layer. For example, when the pixel arrangement structure is applied to an OLED display substrate and the first sub-pixel and the fourth sub-pixel are of the same color, the light emitting layer patterns of the first sub-pixel and the fourth sub-pixel in the same pixel group can also be formed by vapor deposition using the same opening of the mask plate.

For example, the first sub-pixel 111 and the fourth sub-pixel 114 can be sub-pixels of human eye sensitive color, for example, may be green sub-pixels, yellow sub-pixels, white sub-pixels, etc. For example, the areas of the first sub-pixel 111 and the fourth sub-pixel 114 are relatively small compared to the second sub-pixel 112 and the third sub-pixel 113. For example, the area of the first sub-pixel 111 is smaller than the area of the second sub-pixel 112, and/or the area of the first sub-pixel 111 is smaller than the area of the third sub-pixel 113. Similarly, the fourth sub-pixel 114 may refer to the above description of the area of the first sub-pixel 111. That is, the area of the fourth sub-pixel 114 is smaller than the area of the second sub-pixel 112, and/or the area of the fourth sub-pixel 114 is smaller than the area of the third sub-pixel 113.

The pixel arrangement structure provided by at least one embodiment of the present disclosure can improve the distribution uniformity of the sensitive color sub-pixels by adjusting the spacing of the sensitive color sub-pixels in the visual position, thereby improving the visual resolution of the pixel arrangement structure and improving the display quality.

The second sub-pixel 112 and the third sub-pixel 113 may be sub-pixels of color insensitive to human eyes. For example, one of the second sub-pixel 112 and the third sub-pixel 113 is a red sub-pixel and the other is a blue sub-pixel, but is not limited thereto. In this embodiment of the present disclosure, the second sub-pixel 112 is a red sub-pixel and the third sub-pixel 113 is a blue sub-pixel. It should be noted that when the pixel arrangement structure adopts the red green blue (RGB) mode, the above-mentioned human eye sensitive color can be green.

As illustrated in FIG. 2, the first line segment LS1 can extend in the first direction X and the second line segment LS2 can extend in the second direction Y. For example, the first direction X is perpendicular to the second direction Y. For example, in each pixel group 01, the first sub-pixel 111 and the fourth sub-pixel 114 are arranged with the first direction X as an axis of symmetry, so that the pixel structure is arranged more uniformly. For example, the first sub-pixel 111 is uniformly arranged relative to the second sub-pixel 112 and the third sub-pixel 113, and is kept consistent, so that the pixel structure is arranged more uniformly.

As illustrated in FIG. 2, in the pixel arrangement structure provided by one or more embodiments of the present disclosure, the second line segment LS2 is perpendicular to the first line segment LS1. Thus, the pixel arrangement can be made more uniform. For example, the second line segment LS2 is located on the perpendicular bisector of the first line segment LS1. At this time, the widths of sub-pixels of each color in the first direction X can be the same, but are not limited thereto. Therefore, the pixel structure distribution can be made more uniform, the picture display quality is higher, and the problem of display graininess at lower PPI is improved.

As illustrated in FIG. 2, for convenience of description, a plurality of square dashed frames are provided, each dashed frame has a length of 1/2 L, and four dashed frames can form a square with a side length of L. In FIG. 2, there is a pixel group 01 in the dark rectangle dashed frame. The pixel group 01 can be the minimum repeating unit of the pixel arrangement structure. For example, the pixel arrangement structure can be obtained by translating and copying the minimum repeating unit. For example, sub-units that can be translated and repeated to be arranged to form a pixel structure are not included in the minimum repeating unit.

As illustrated in FIG. 2, the first line segment SL is perpendicular to the second line segment SL2 and is vertically bisected with each other. The first line segment SL1 vertically bisects the second line segment SL2. The second line segment SL2 also vertically bisects the first line segment SL1. For example, in the pixel group 01, the maximum area enclosed by the connection lines between the centers of the first sub-pixel 111, the second sub-pixel 112, the fourth sub-pixel 114 and the third sub-pixel 113 is rhombus, and the first line segment SL1 and the second line segment SL2 are respectively diagonal lines of the rhombus.

As illustrated in FIG. 2, in the pixel group 01, the distance between the center C1 of the first sub-pixel 111 and the center C4 of the fourth sub-pixel 114 can be greater than or equal to 1/2 L, for example, the distance can range from 1/2 L to L. For example, the first sub-pixel 111 and the fourth sub-pixel may adopt sub-pixels of the same color. When the first sub-pixel 111 and the fourth sub-pixel adopt sub-pixels of the same color, such as the first sub-pixel 111, the setting of the distance can also avoid the situation that two adjacent first sub-pixels are difficult to distinguish due to the close distance between the adjacent first sub-pixels and are combined into one by human vision, thus avoiding the graininess caused thereby. Therefore, the pixel arrangement structure can improve the distribution uniformity of the first sub-pixels, thereby improving the visual resolution and also improving the display quality.

As illustrated in FIG. 2, the distance between the center C3 of the third sub-pixel 113 and the center C2 of the second sub-pixel 112 can be 4/3 L. In order to make the ratio of the length of the second line segment LS2 to the length of the first line segment LS1 less than or equal to 3/4, the distance between the third sub-pixel 113 and the second sub-pixel 112 in the same pixel group can be increased and/or the distance between the first sub-pixel 111 and the fourth sub-pixel 114 can be decreased under the condition permitted by the process.

As illustrated in FIG. 2, in the pixel arrangement structure provided by one or more embodiments of the present disclosure, in order to obtain a closely arranged pixel structure, the ratio of the lengths of the second line segment LS2 and the first line segment LS1 can be greater than or equal to 3/8.

For example, as illustrated in FIG. 2A, in a pixel group, the first sub-pixel 111 and the second sub-pixel 112 are sub-pixels of different colors, the first sub-pixel 111 and the second sub-pixel 112 form a pixel P, the third sub-pixel 113 and the fourth sub-pixel 114 are sub-pixels of different colors, the third sub-pixel 113 and the fourth sub-pixel 114 form a pixel P, and sub-pixels of other surrounding pixels need to be borrowed for color display when displaying an image. For example, the first sub-pixel 111 and the fourth sub-pixel 114 are green sub-pixels, the second sub-pixel 112 is red sub-pixel, and the third sub-pixel 113 is blue sub-pixel. For example, a red sub-pixel and a green sub-pixel form a pixel, and a blue sub-pixel and a green sub-pixel form a pixel. The pixel P here only includes sub-pixels of two colors. When displaying an image, it is necessary to use sub-pixels of other surrounding pixels for color display. Therefore, the pixel P here can also be referred to as a virtual pixel.

Figure 3A:
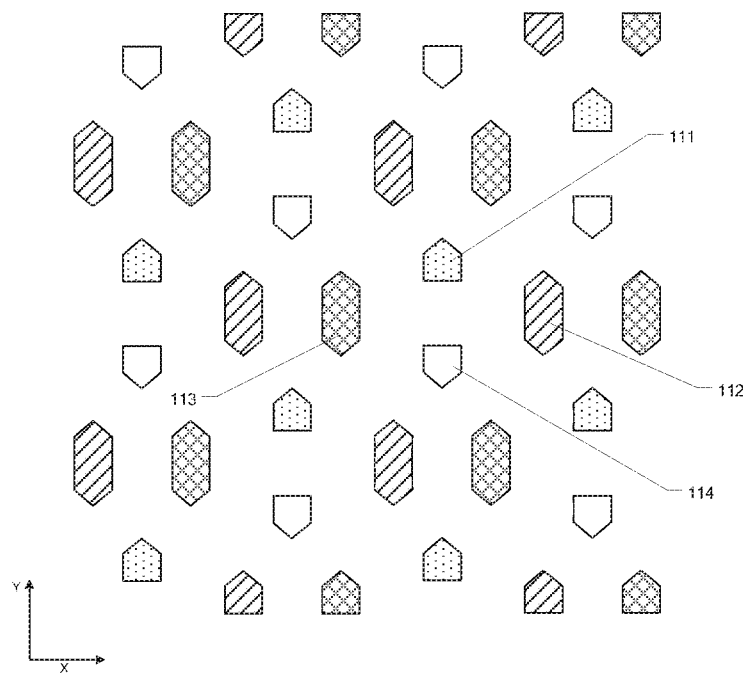
FIG. 3A is a schematic diagram of a pixel arrangement structure according to an embodiment of the present disclosure.

FIG. 3A illustrates the pixel arrangement structure with the dashed lines in FIG. 2 removed. The dashed lines, centers, etc. given in the embodiments of the present disclosure are for convenience of describing the given virtual lines, virtual centers. For example, the center can be the center of gravity, the intersection point of perpendicular bisector of opposite sides, etc., but is not limited thereto.

Figure 3B:
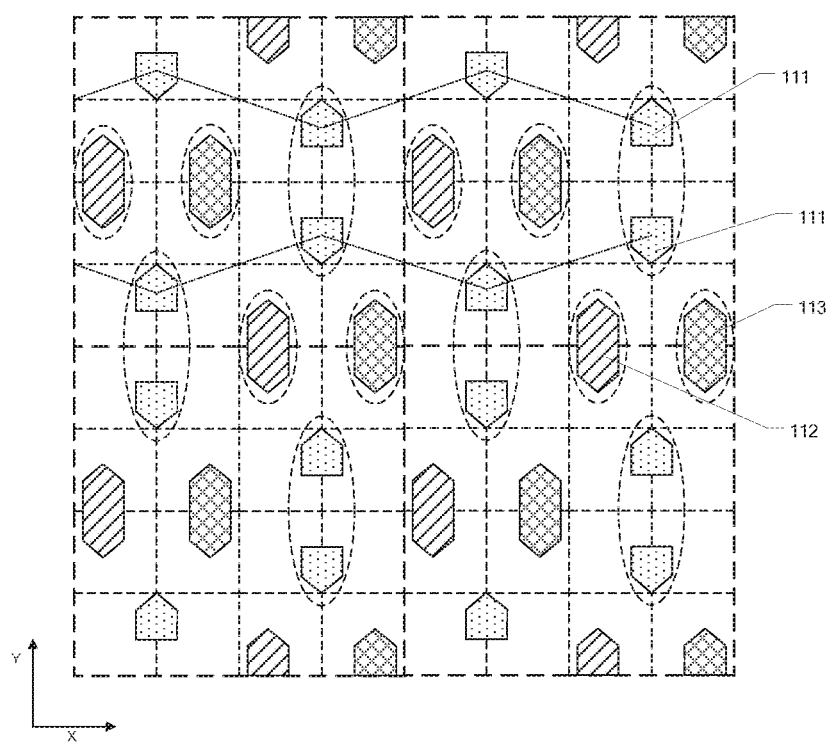
FIG. 3B is a schematic diagram of a pixel arrangement structure according to another embodiment of the present disclosure.

FIG. 3B illustrates a pixel arrangement structure provided by one or more embodiments of the present disclosure. In the same pixel group 01, the first sub-pixel 111 and the fourth sub-pixel 114 adopt the same color. For example, both are the first sub-pixel 111. Because the sub-pixels of the same color do not have the problem of color mixing, the light emitting layer patterns of the first sub-pixel 111 and the fourth sub-pixel 114 in the same pixel group 01 can be vapor deposited using the same opening of the mask plate, thereby being beneficial to the screening of the mask plate, having small screening pressure and improving the quality of the screening.

As illustrated in FIG. 3B, because the slope of the first sub-pixels 111 of the same row is low, when the first sub-pixels 111 belonging to the same row display straight lines together, the fluctuation amplitude of the first sub-pixels of adjacent pixel groups is small due to the low slope (dashed line with dense dots in FIG. 3B), thus avoiding the situation that two straight lines generated by interlocking with straight lines displayed in adjacent rows due to large fluctuation amplitude are difficult to distinguish and are combined into one visually by human eyes. Therefore, the pixel arrangement structure can improve the visual resolution.

Figure 3C:
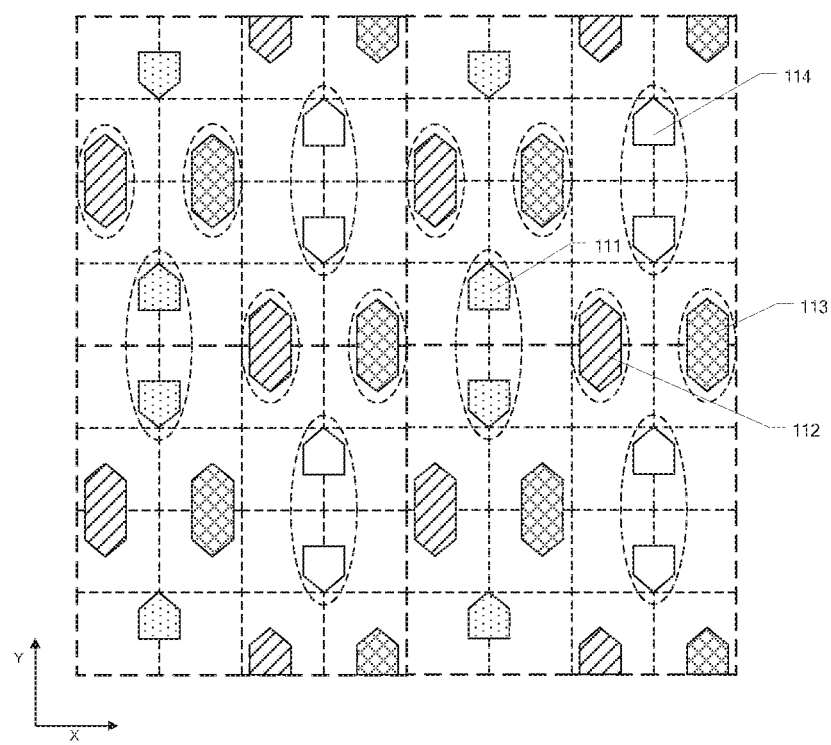
FIG. 3C is a schematic diagram of a pixel arrangement structure according to another embodiment of the present disclosure.

FIG. 3C illustrates a pixel arrangement structure provided by one or more embodiments of the present disclosure. As illustrated in FIG. 3C, in each pixel group 01, the first sub-pixel 111 and the fourth sub-pixel 114 are sub-pixels of the same color, and can include, for example, two types of pixel groups, in which pairs of sub-pixels of the same color in one type of pixel group are first sub-pixels (e.g., green sub-pixels), and pairs of sub-pixels of the same color in another type of pixel group are fourth sub-pixels (e.g., white sub-pixels or yellow sub-pixels). The colors of the two sub-pixels arranged in pairs between the second sub-pixel and the third sub-pixel in the pixel group adjacent in the diagonal direction of each pixel group are different from the colors of the sub-pixels arranged in pairs between the second sub-pixel and the third sub-pixel in the pixel group.

Figure 4:
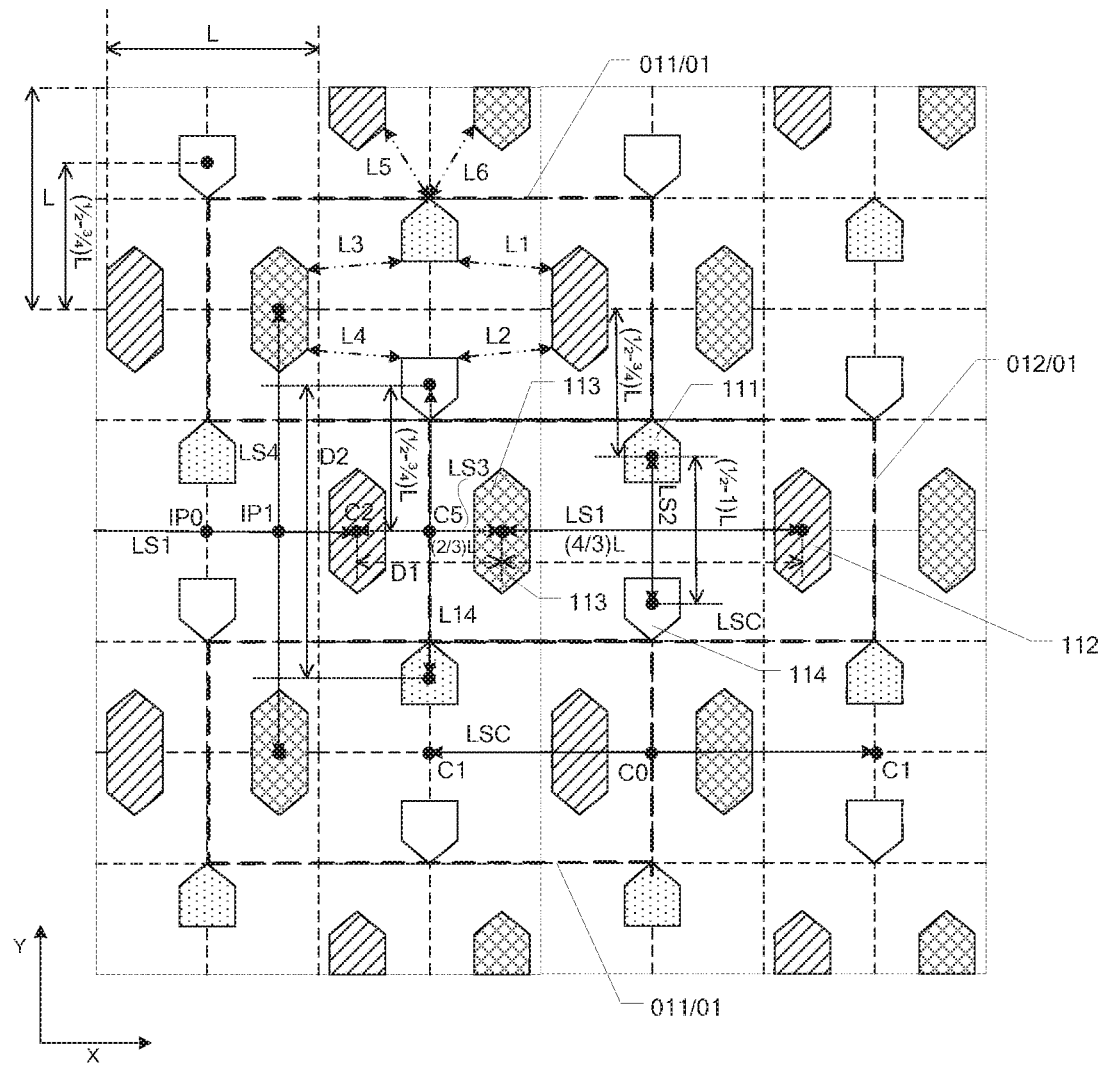
FIG. 4 is a schematic diagram of a pixel arrangement structure according to an embodiment of the present disclosure.

FIG. 4 illustrates a pixel arrangement structure provided by one or more embodiments of the present disclosure. As illustrated in FIG. 4, the first line segment LS1 can extend in the first direction X, and a length D1 of a center connection line LS3 between the second sub-pixels 112 and the third sub-pixels 113 that are adjacent to each other in two adjacent ones of the plurality of pixel groups 01 in the first direction X is less than a length of the first line segment LS1, so that pixels can be closely arranged. In FIG. 4, the length of the first line segment LS1 is 4/3 L, but is not limited thereto. For example, the length of the first line segment LS1 can range from 11/9 L to 13/9 L.

For example, in order to allow the tight arrangement of pixels and process conditions to be combined, the ratio of the length D1 of the center connection line LS3 between the center of the second sub-pixel 112 and the center of the third sub-pixel 113 that are adjacent to each other in the two adjacent ones of the plurality of pixel groups 01 in the first direction to the length of the first line segment LS1 is less than or equal to 1/2. In FIG. 4, the length D1 is 2/3 L, but it is not limited thereto. For example, the length D1 can range from 5/9 L to 7/9 L.

As illustrated in FIG. 4, in the pixel arrangement structure provided by one or more embodiments of the present disclosure, a plurality of pixel groups 01 are arranged in an array, including a plurality of rows and a plurality of columns, for example, the pixel arrangement structure includes a plurality of first pixel groups 011 located in odd rows and a plurality of second pixel groups 012 located in even rows. For example, pixel groups of even rows and pixel groups of odd rows are arranged in a staggered way. The second line segment LS2 can extend in the second direction Y. For example, in order to realize pixel arrangement density in the column direction, in the adjacent odd rows or in the adjacent even rows, the length D2 of the center connection line L14 between the first sub-pixel 111 and the fourth sub-pixel 114 that are adjacent to each other in two adjacent ones of the plurality of pixel groups 01 in the second direction Y is greater than the length of the second line segment LS2. For example, in adjacent odd rows or in adjacent even rows, the ratio of the length D2 of the center connection line LI4 between the first sub-pixel 111 and the fourth sub-pixel 114 that are adjacent to each other in the two adjacent ones of the plurality of pixel groups 01 in the second direction Y to the length of the second line segment LS2 ranges from 1 to 3.

For example, in two adjacent ones of the odd rows or in two adjacent ones of the even rows, the length D2 of the center connection line L14 between the first sub-pixel 111 and the fourth sub-pixel 114 that are adjacent to each other in the two adjacent ones of the plurality of pixel groups 01 in the second direction Y is greater than the length of the second line segment LS2. Thus, a pixel structure in which six pixel groups are closely arranged around one pixel group can be formed. The odd row pixel groups and the even row pixel groups are staggered. For example, the odd row pixel groups and the even row pixel groups are offset in the first direction X by the length of half a pixel group in the first direction X, for example, the offset length is L, but is not limited thereto. For example, in two adjacent ones of the odd rows or in adjacent ones of the even rows, the ratio of the length D2 of the center connection line between the first sub-pixel 111 and the fourth sub-pixel 114 that are adjacent to each other in the two adjacent ones of the plurality of pixel groups 01 in the second direction Y to the length of the second line segment LS2 ranges from 1 to 3.

As illustrated in FIG. 4, in the pixel arrangement structure provided by one or more embodiments of the present disclosure, an extension line of the second line segment LS2 of each pixel group 01 passes through a midpoint C0 of a center connection line LSC between two pixel groups 01 that are adjacent to the pixel group 01 in the second direction Y and are located in the same row. The center of each pixel group 01 is C1, and the connection line between the centers C1 of two adjacent pixel groups 01 is the center connection line LSC. For example, the center C1 of the pixel group 01 may be the intersection point of the first line segment LS1 and the second line segment LS2.

For example, the extension line of the second line segment LS2 of each first pixel group 011 passes through the center C5 of the center connection line LS3 between the adjacent third sub-pixel 113 and the second sub-pixel 112 of the two second pixel groups 012 adjacent to the first pixel group 011 and located in the same row. For example, the center C5 and the center C0 can be the same point.

As illustrated in FIG. 4, in the pixel arrangement structure provided by one or more embodiments of the present disclosure, in two adjacent ones of the odd rows or in two adjacent ones of the even rows, an intersection point IP1 of a center connection line LS4 between two third sub-pixels 113 in two adjacent ones of the plurality of pixel groups 01 (two adjacent first pixel groups 011 or two adjacent second pixel groups 012) arranged in the second direction Y and the first line segment LS1 in a pixel group 01 located between the two third sub-pixels 113 is located between a center IP0 of the first line segment LS1 and a center C2 of the second sub-pixel 112. For example, the center IP0 of the first line segment LS1 can be the center C1 of the pixel group 01. For example, the intersection point IP1 is located at the midpoint of the connection line between the center IP0 of the first line segment LS1 and the center C2 of the second sub-pixel 112.

For example, in adjacent odd rows, the intersection point IP1 of the center connection line LS4 between the two third sub-pixels 113 of the adjacent first pixel groups 011 located in the same column and the first line segment LS1 of the second pixel group 012 adjacent to the third sub-pixel 113 is located at a position between the intersection point IP0 of the first line segment LS1 and the second line segment LS2 of the second pixel group 012 and the center C2 of the second sub-pixel 112. The third sub-pixel 113 above-mentioned can also be replaced by the second sub-pixel 112.

For example, in two adjacent ones of the odd rows or two adjacent ones of the even rows, the intersection point of the center connection line between two second sub-pixels 112 in two adjacent pixel groups 01 (two adjacent first pixel groups 011 or two adjacent second pixel groups 012) arranged in the second direction Y and the first line segment LS1 in the pixel group 01 located between the two second sub-pixels 112 is located between the center IP0 of the first line segment LS1 and the center C3 of the third sub-pixel 113. For example, the intersection point is located at the midpoint of the connection line between the center IP0 of the first line segment LS1 and the center C3 of the third sub-pixel 113.

As illustrated in FIG. 4, in the pixel arrangement structure provided by one or more embodiments of the present disclosure, in the same pixel group, the closest distance between the second sub-pixel 112 and the first sub-pixel 111 is L1, the closest distance between the second sub-pixel 112 and the fourth sub-pixel 114 is L2, the closest distance between the third sub-pixel 113 and the first sub-pixel 111 is L3, the closest distance between the third sub-pixel 113 and the fourth sub-pixel 114 is L4, and L=L2=L3=L4.

As illustrated in FIG. 4, in the pixel arrangement structure provided by one or more embodiments of the present disclosure, the closest distance between the second sub-pixel 112 and one of the first sub-pixel 111 and the fourth sub-pixel 114 is L5, the closet distance between the third sub-pixel 113 and one of the first sub-pixel 111 and the fourth sub-pixel 114 is L6, the second sub-pixel 112 and the third sub-pixel 113 are in a pixel group being adjacent to the first sub-pixel 111 or the fourth sub-pixel 114 in the second direction and are not in the same row with the first sub-pixel 111 or the fourth sub-pixel 114, and L5=L6.

For example, in an embodiment, L1=L2=L3=L4=L5=L6.

Figure 7A:
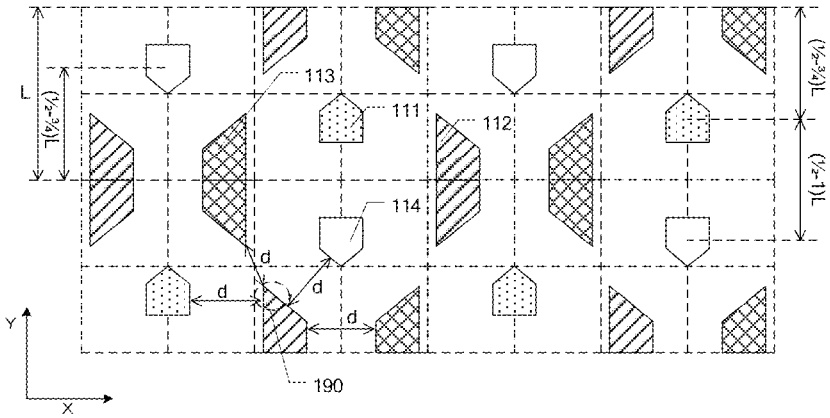
FIG. 7A is a schematic diagram of a pixel arrangement structure according to another embodiment of the present disclosure.
Figure 7B:
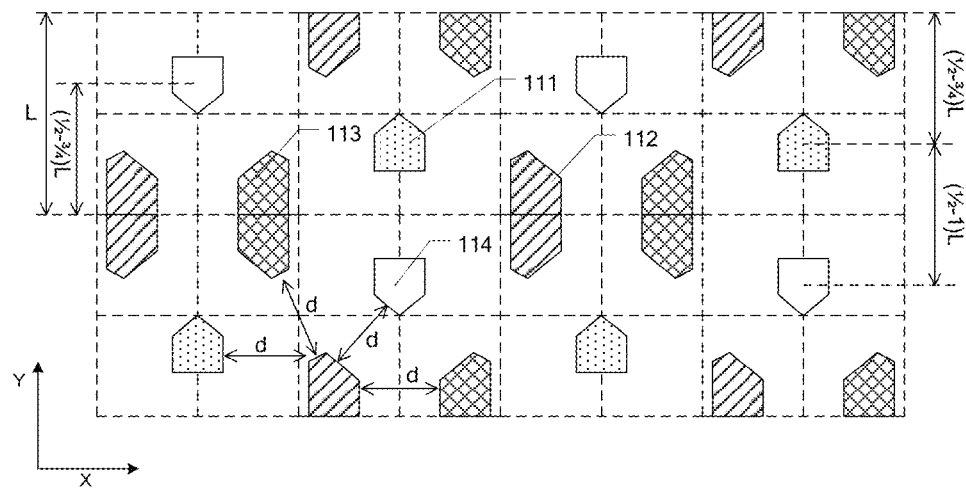
FIG. 7B is a schematic diagram of a pixel arrangement structure according to another embodiment of the present disclosure.

For example, with respect to L, L2, L3, LA, L5, and L6, the marks about the minimum process spacing d in FIGS. 7A and 7B can also be referred to. Each of the closest distances is the minimum distance between two sub-pixels. For example, L1, L2, L3. L4, L5, and L6 can be made as close as possible to the minimum process spacing d during actual fabrication. For example, the closest distance is the distance between the closest two points on the outer edge of the two sub-pixels.

As illustrated in FIG. 4, in the pixel arrangement structure provided by one or more embodiments of the present disclosure, the opposite sides of two adjacent sub-pixels are approximately parallel or have an included angle less than 45 degrees, and the adjacent sub-pixels include any two adjacent ones selected from the group consisting of the first sub-pixel 111, the second sub-pixel 112, the third sub-pixel 113, and the fourth sub-pixel 114.

Figure 5A:
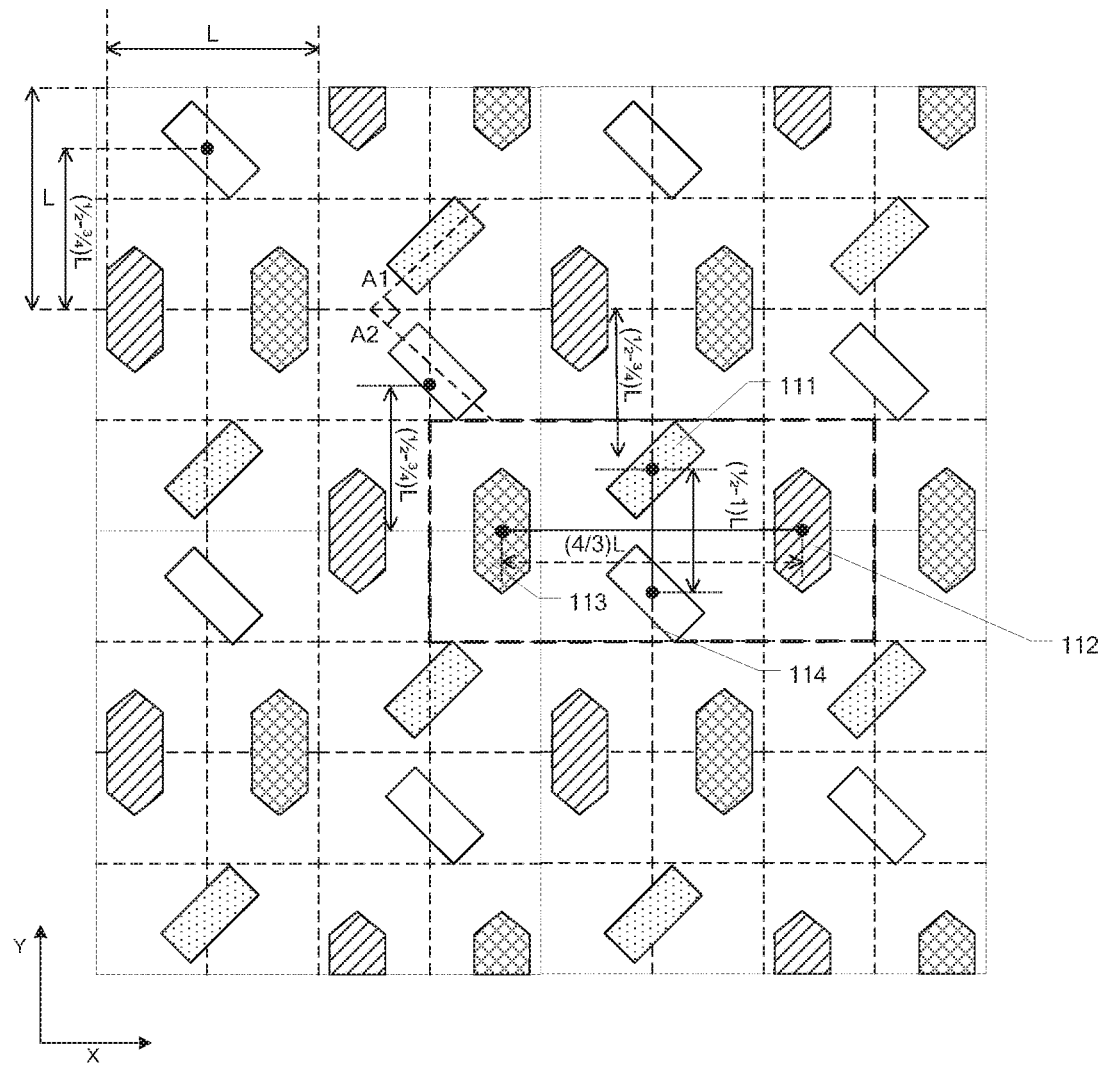
FIG. 5A is a schematic diagram of a pixel arrangement structure according to another embodiment of the present disclosure.

As illustrated in FIG. 5A, in the pixel arrangement structure provided by one or more embodiments of the present disclosure, the first sub-pixel 111 and the fourth sub-pixel 114 are both strip-shaped, and the extension direction A1 of the first sub-pixel 111 does not coincide with the extension direction A2 of the fourth sub-pixel 114. For example, the extension direction A1 of the first sub-pixel 111 intersects or has an included angle with the extension direction A2 of the fourth sub-pixel 114. For example, in each pixel group, the first sub-pixel 111 and the fourth sub-pixel 114 are arranged with the first direction X as an axis of symmetry and inclined at a certain angle. For example, the included angle between the inclination angle and the first direction X ranges from 30 to 50 degrees, and further for example, the included angle is 45 degrees, but is not limited thereto. For example, the extension direction A1 of the first sub-pixel 111 can be the long axis direction of the first sub-pixel 111, but is not limited thereto. For example, the extension direction A2 of the fourth sub-pixel 114 can be the long axis direction of the fourth sub-pixel 114, but is not limited thereto.

As illustrated in FIG. 5A, in each pixel group 01 of the pixel arrangement structure provided by one or more embodiments of the present disclosure, the first sub-pixel 111 and the fourth sub-pixel 114 are symmetrically arranged with respect to the first line segment LS1. For example, in each pixel group 01, the first sub-pixel 111 and the fourth sub-pixel 114 are asymmetrically arranged with respect to the second line segment LS2.

For example, the second sub-pixel 112 and the third sub-pixel 113 are symmetrically arranged with respect to the second line segment LS2, but is not limited thereto.

For example, in this embodiment of the present disclosure, the strip shape means that a length in one direction is greater than a length in another direction, or a dimension in one direction is greater than a dimension in other directions. The strip shape is not limited to a rectangle, and can be other shapes, for example, may be a long hexagonal shape, an oblong shape, a trapezoid shape, or other shapes. In the embodiments of the present disclosure, the shape of each sub-pixel is not limited to a regular shape, and can be an irregular shape.

For example, the included angle between the extension direction A1 of the first sub-pixel 111 and the extension direction A2 of the fourth sub-pixel 114 ranges from 70 degrees to 100 degrees, further, the included angle can be from 80 degrees to 95 degrees, further, the included angle can be 90 degrees (a right angle), so that the first sub-pixel 111 and the fourth sub-pixel 114 forming a larger area can be utilized to improve the light emitting area and is beneficial to the screening of the mask plate during fabricating the mask plate of the light emitting layer pattern. For example, in a case where the included angle is a right angle, deviations of up and down several degrees can be allowed. For example, it can deviate from 90 degrees by 5 degrees.

Figure 5B:
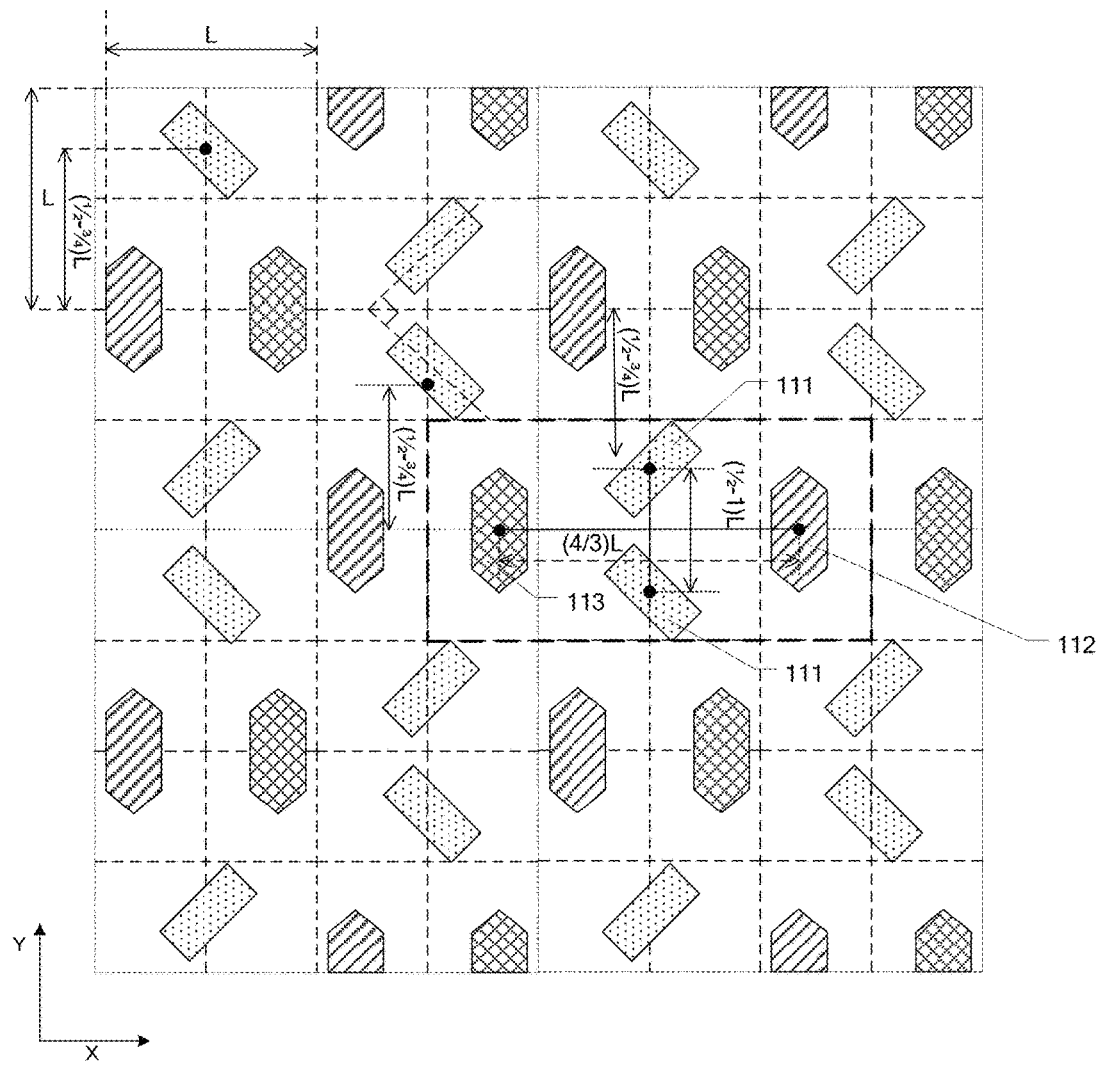
FIG. 5B is a schematic diagram of a pixel arrangement structure according to another embodiment of the present disclosure.

FIG. 5B illustrates a pixel arrangement structure provided by one or more embodiments of the present disclosure, in the pixel arrangement structure, an included angle between an extension direction A1 of the first sub-pixel 111 and an extension direction A2 of the fourth sub-pixel 114 is a right angle, and in the same pixel group 01, the first sub-pixel 111 and the fourth sub-pixel 114 are sub-pixels of the same color.

Figure 6:
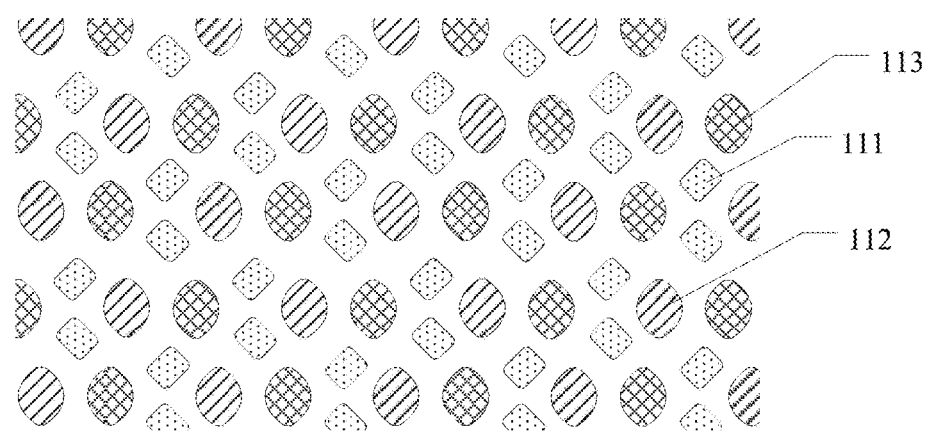
FIG. 6 is a schematic diagram of a pixel arrangement structure according to another embodiment of the present disclosure.

FIG. 6 illustrates a pixel arrangement structure provided by one or more embodiments of the present disclosure. As illustrated in FIG. 6, the second sub-pixel 112 and the third sub-pixel 113 can be rhombus or approximately rhombus. Approximate rhombus includes, for example, rounded rhombus, chamfered rhombus, etc., but is not limited thereto. The sub-pixel shape of rhombus or approximately rhombus shape is more favorable for pixel dense arrangement. For example, the first sub-pixel 111 can be relatively symmetrical around the third sub-pixel 113 and the second sub-pixel 112, with the long sides of the first sub-pixel 111 all facing the second sub-pixel 112 and the short sides all facing the third sub-pixel 113 to ensure the uniformity of pixel arrangement to the greatest extent. The arrangement of the first sub-pixels 111 is more uniform, which can improve the color edge to a certain extent, is conducive to the realization of high PPI, and can improve the pixel aperture ratio as high as possible.

The shape of each sub-pixel is not limited to the above, and the shapes of the sub-pixels can be adjusted as required. Maximizing the area is the main principle for determining the shape of sub-pixels.

In order to avoid color mixing, the spacing between different color sub-pixels should be greater than the minimum process spacing d of the patterning process, and some special process symmetry requirements should be considered. For example, the FMM screening requires symmetrical opening patterns and distribution, and the shapes of the first sub-pixel and the fourth sub-pixel can be symmetrical pentagons with right-angle bottom corners respectively (as illustrated in FIG. 2E). It can be seen that the spacing between the second and third sub-pixel of adjacent pixel groups using symmetrically shaped sub-pixels are significantly larger than other spacing between different color sub-pixels (the minimum process spacing d), i.e., there is still usable area in design. Under the condition that FMM screening technology allows or adopts other symmetry insensitive (e.g. CF) processes, asymmetrical sub-pixel shapes can be adopted to realize maximum sub-pixel area.

FIGS. 7A and 7B illustrate pixel arrangement structures provided by one or more embodiments of the present disclosure. As illustrated in FIGS. 7A and 7B, under the condition that asymmetric sub-pixel shapes are allowed to be adopted, according to the minimum process spacing d of different patterning processes, the shapes of the second sub-pixel 112 and the third sub-pixel 113 can be right-angle trapezoids or right-angle trapezoids with acute angles cut off, so as to maximize the area.

As illustrated in FIG. 7A, because the shapes of the second sub-pixel 112 and the third sub-pixel 113 are both right-angle trapezoids, compared to the case where the shapes of the second sub-pixel 112 and the third sub-pixel 113 are both hexagonal (a hexagonal shape formed by combining two pentagons with symmetrical right-angle bottom angles), the acute angle portions 190 of the second sub-pixel 112 and the third sub-pixel 113 can further improve the areas of the second sub-pixel 112 and the third sub-pixel 113, and thus further improve the space utilization rate in the pixel group. The pixel arrangement structure can improve the space utilization rate in the pixel group.

As illustrated in FIG. 7B, the shapes of the second sub-pixel 112 and the third sub-pixel 113 are both isosceles trapezoids with acute angles cut off. Therefore, when the process accuracy is constant, that is, when the distances between the first sub-pixel 111 and the second sub-pixel 112 and between the first sub-pixel 111 and the third sub-pixel 113 are constant, the areas of the second sub-pixel 112 and the third sub-pixel 113 are increased, thereby improving the utilization rate of the space within the pixel group.

In the pixel arrangement structure provided by one or more embodiments of the present disclosure, the shapes of the second sub-pixel 112 and the third sub-pixel 113 include at least one of isosceles trapezoid, hexagon and rhombus, and the shape of the second sub-pixel 112 includes at least one of pentagon, rectangle and approximate rectangle. The approximate rectangle includes, for example, but is not limited to, a rounded rectangle.

At least one embodiment of the present disclosure provides a display substrate including any one of the above pixel arrangement structures.

Figure 8:
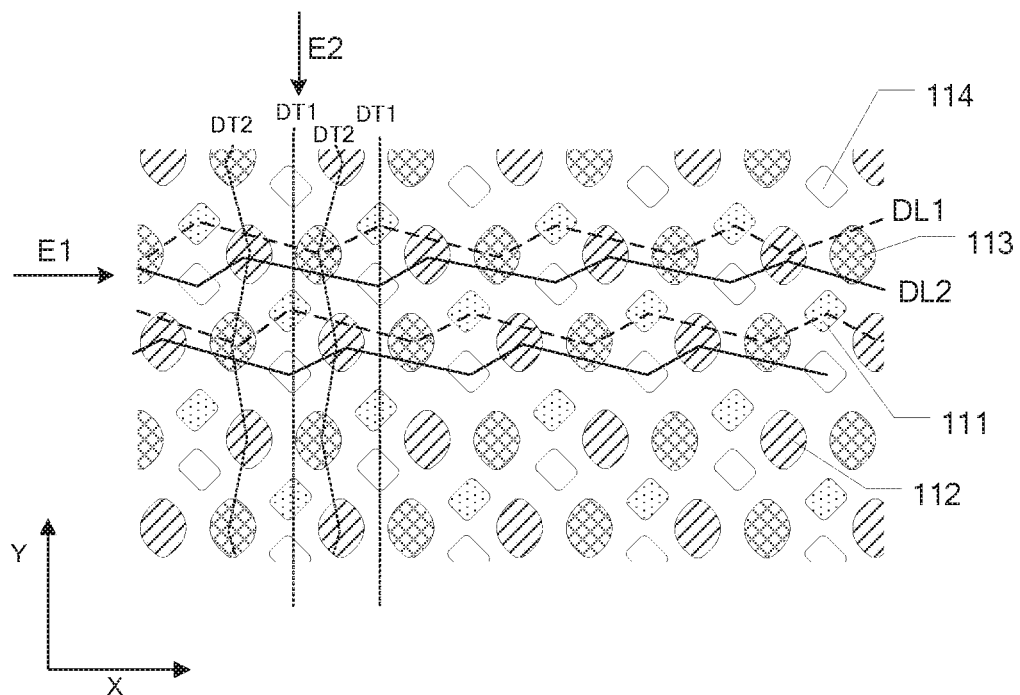
FIG. 8 is a schematic diagram of a pixel arrangement structure, drive lines, and data lines according to another embodiment of the present disclosure.

FIG. 8 illustrates a display substrate provided by one or more embodiments of the present disclosure. As illustrated in FIG. 8, in the same row of pixel groups, the third sub-pixel 113 and the first sub-pixel 111 can be driven by the first drive line DL1, and the second sub-pixel 112 and the fourth sub-pixel 114 can be driven by the second drive line DL2. The first drive line DL1 extends in the direction E1 and the second drive line DL2 extends in the direction E1. For example, the direction E1 is parallel to the first direction X.

As illustrated in FIG. 8, the first sub-pixel 111 and the fourth sub-pixel 114 in the odd column pixel group can use the first data line DT1 to input data signals, and the second sub-pixel 112 and the third sub-pixel 113 located between the adjacent two first data lines DT1 can use the second data line DT2 to input data signals. For example, the data signal includes a voltage and/or a current. The first data line DT1 extends in the direction E2, and the second data line DT2 also extends in the direction E2, which is parallel to the second direction Y.

For example, one pixel group includes two pixel units, for example, the first sub-pixel 111 and the second sub-pixel 112 form a pixel unit, the third sub-pixel 113 and the fourth sub-pixel 114 form the other pixel unit. Each pixel unit can share the third sub-pixel 113 or the fourth sub-pixel 114 adjacent thereto for full color display. The display is realized by sub-pixel sharing.

Figure 9:
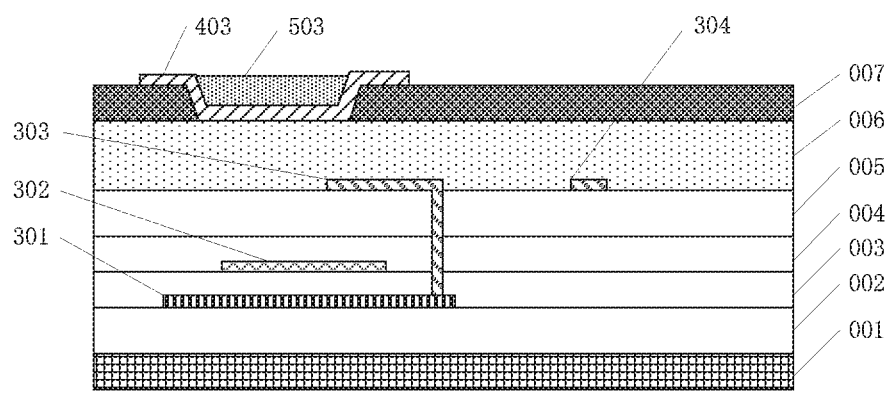
FIG. 9 is a cross-sectional view of a display substrate according to an embodiment of the present disclosure.

FIG. 9 is a cross-sectional view of a display substrate provided by an embodiment of the present disclosure. As illustrated in FIG. 9, the structure includes a base substrate 001, and a buffer layer 002, a first gate insulation layer 003, a second gate insulation layer 004, an interlayer dielectric layer 005, a planarization layer 006, and a pixel defining layer 007 sequentially located on the base substrate 001. As can be seen from FIG. 9, below the sub-pixel, there is a thin film transistor structure including a gate electrode 302, an active layer 301, and a drain electrode 303. The thin film transistor can be one of the thin film transistors in a pixel drive circuit, and the connection relationship with other components can be set according to the specific pixel circuit arrangement, which is not illustrated in detail herein. In addition, a signal line 304 can also be included at a position on the same layer as the drain electrode 303, and the signal line 304 can also be used as a signal line of a specific function according to different pixel circuit arrangements, for example, a data line or a gate line, etc. As can be seen from FIG. 9, the pixel defining layer 007 can include openings defining sub-pixels. The anode 403 of the sub-pixel and the light emitting layer 503 of the third sub-pixel are located in the openings of the pixel defining layer 007. It should be noted that the structure of the display substrate is not limited to that illustrated in FIG. 9.

For example, the anode 403 and the light emitting layer 503 are in contact with each other, so that the light emitting layer can be driven to emit light at a portion in contact with each other, and therefore, the portion in contact with each other between the anode 403 and the light emitting layer 503 is an effective portion in which the sub-pixel can emit light. Here, the anode 403 serves as a pixel electrode so that different data voltages can be applied to different sub-pixels. However, in the embodiments according to the present disclosure, the electrode used as the pixel electrode of the sub-pixel is not limited to the anode, and the cathode of the light emitting diode may also be used as the pixel electrode. Therefore, in the embodiments of the present disclosure, the shape of the sub-pixel can refer to the shape of a portion where the pixel electrode and the light emitting layer contact each other. For example, for each sub-pixel, the area of the pixel electrode can be slightly larger than the area of the light emitting layer, or the area of the light emitting layer can be slightly larger than the area of the pixel electrode, and the embodiments of the present disclosure is not particularly limited to this. For example, the light emitting layer here can include the electroluminescent layer itself and other function layers located on both sides of the electroluminescent layer, for example, a hole injection layer, a hole transport layer, an electron injection layer, an electron transport layer, and the like. In some embodiments, the shape of a pixel can also be defined by a pixel defining layer. For example, a lower electrode (e.g., an anode) for a light emitting diode can be disposed below a pixel defining layer including an opening for defining a pixel that exposes a portion of the lower electrode. When the light emitting layer is formed in the opening in the pixel defining layer described above, the light emitting layer contacts the lower electrode so that the light emitting layer can be driven to emit light at this portion. Therefore, in this case, the opening of the pixel defining layer defines the shape of the sub-pixel.

For example, the pixel circuit includes at least one transistor including a gate electrode, an active layer, a source electrode, and a drain electrode. In one example, the signal line is electrically connected to the source electrode or drain electrode of the corresponding transistor through a via hole penetrating through the insulation layer below it. In one example, the active layer of the transistor is formed of a polysilicon layer. On both sides of the channel region of the active layer, the polysilicon layer is conductive to form the source electrode and the drain electrode. For example, the signal line is electrically connected to the polysilicon source or drain electrodes formed by conducting through a via hole. For example, the transistor is a top gate transistor, and a via hole for electrically connecting the signal line to the source or drain electrodes of the corresponding transistor passes through the gate metal layer and the data metal layer, and a portion of the metal pattern of the gate metal layer and the data metal layer can be used as a relay connector for electrically connecting the via hole, but embodiments of the present disclosure are not limited thereto.

For example, the shapes of the various sub-pixels described in the embodiments of the present disclosure are all approximate shapes. When forming the light emitting layer or various electrode layers, it is not guaranteed that the edges of the sub-pixels are strictly straight lines and the corners are strictly angular. For example, the light emitting layer can be formed by a mask vapor deposition process, and therefore, its corners can be rounded. In some cases, metal etching can have a draft angle, so when forming a light emitting layer of a sub-pixel by vapor deposition, one angle of the light emitting layer can be removed.

For example, the shapes of the sub-pixels are the shapes of the orthographic projections of the sub-pixels on the base substrate.

At least one embodiment of the present disclosure provides a display device including any one of the above display substrates. Thus, the resolution of the display device can be improved, and further a display device with real high resolution can be provided. In addition, because the symmetry of the pixel arrangement structure is better, the display effect of the display device is better.

For example, in some examples, the display device can be any product or component with display function such as a smart phone, a tablet computer, a television, a display, a notebook computer, a digital photo frame, a navigator, etc.

The following statements should be noted:

(1) The accompanying drawings involve only the structure(s) in connection with the embodiment(s) of the present disclosure, and other structure(s) can be referred to common design(s).

(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A pixel arrangement structure, comprising a plurality of pixel groups;
    wherein each of the plurality of pixel groups comprises a first sub-pixel, a second sub-pixel, a third sub-pixel and a fourth sub-pixel;
    in each of the plurality of pixel groups, a connection line between a center of the second sub-pixel and a center of the third sub-pixel is a first line segment, the first sub-pixel and the fourth sub-pixel are between the second sub-pixel and the third sub-pixel and are respectively at two sides of the first line segment;
    a connection line between a center of the first sub-pixel and a center of the fourth sub-pixel is a second line segment;
    a length of the second line segment is less than a length of the first line segment,
    the first line segment extends in a first direction and the second line segment extends in a second direction,
    the first sub-pixel comprises a first edge extending along the first direction and a first corner portion, the fourth sub-pixel comprises a second edge extending along the first direction and a second corner portion,
    in the same one of the plurality of pixel groups, the first edge and the second edge facing with each other, the first corner portion is located at a side of the first edge away from the second edge, and the second corner portion is located at a side of the second edge away from the first edge,
    the first edge of the first sub-pixel has a first length, a first rectangle region having a width equal to the first length and extending along the second direction completely covers a column of first sub-pixels arranged along the second direction, the first rectangle region is spaced apart from the second sub-pixels of the plurality of pixel groups by at least a first spacing distance, and spaced apart from the third sub-pixels of the plurality of pixel groups by at least a second spacing distance, the first spacing distance and the second spacing distance are both greater than 0, the column of first sub-pixels arranged along the second direction comprises at least two first sub-pixels arranged along the second direction,
    a plurality of second sub-pixels are arranged along the second direction to form a second sub-pixel column, and the first rectangle region is spaced apart from the second sub-pixel column that is closest to the first rectangle region by the first spacing distance, a plurality of third sub-pixels are arranged along the second direction to form a third sub-pixel column, and the first rectangle region is spaced apart from the third sub-pixel column that is closest to the first rectangle region by the second spacing distance,
    the shapes of the second sub-pixel and the third sub-pixel are both isosceles trapezoids with two acute angles being cut off, and both isosceles trapezoids with two acute angles being cut off are symmetrical about a virtual line where the first line segment is located,
    each of the isosceles trapezoids with two acute angles being cut off comprises two cut-off corners, one of the two cut-off corners of one second sub-pixel and one of the two cut-off corners of one third sub-pixel which is directly adjacent to the second sub-pixel in the second direction are arranged to face each other.

2. The pixel arrangement structure according to claim 1, wherein in each of the plurality of pixel groups, a distance between the center of the first sub-pixel and the center of the fourth sub-pixel is in a range from (1/2) L to L, a distance between the center of the second sub-pixel and the center of the third sub-pixel is in a range from (11/9) L to (13/9) L,
    L is half of a distance between centers of two first sub-pixels in two pixel groups of the plurality of pixel groups which are adjacent in the first direction.

3. The pixel arrangement structure according to claim 1, wherein, in each of the plurality of pixel groups, the first sub-pixel and the fourth sub-pixel are both strip-shaped, and an extension direction of the first sub-pixel and an extension direction of the fourth sub-pixel do not coincide.

4. The pixel arrangement structure according to claim 3, wherein an included angle between the extension direction of the first sub-pixel and the extension direction of the fourth sub-pixel ranges from 70° to 100°.

5. The pixel arrangement structure according to claim 1, wherein
    the plurality of pixel groups are arranged in an array to form a plurality of rows and a plurality of columns, and pixel groups of even rows and pixel groups of odd rows are arranged in a staggered way;
    a length of a center connection line between the second sub-pixel and the third sub-pixel that are adjacent to each other in two adjacent ones of the plurality of pixel groups in the first direction is less than the length of the first line segment;
    in two adjacent ones of the odd rows or in two adjacent ones of the even rows, a length of a center connection line between the first sub-pixel and the fourth sub-pixel that are adjacent to each other in two adjacent ones of the plurality of pixel groups in the second direction is greater than the length of the second line segment.

6. The pixel arrangement structure according to claim 5, wherein a ratio of the length of the center connection line between the second sub-pixel and the third sub-pixel that are adjacent to each other in two adjacent ones of the plurality of pixel groups in the first direction to the length of the first line segment is less than or equal to 1/2; and/or
    in two adjacent ones of the odd rows or in two adjacent ones of the even rows, a ratio of the length of the center connection line between the first sub-pixel and the fourth sub-pixel that are adjacent to each other in two adjacent ones of the plurality of pixel groups in the second direction to the length of the second line segment ranges from 1 to 3.

7. The pixel arrangement structure according to claim 5, wherein an extension line of the second line segment of each pixel group passes through a midpoint of a center connection line between two pixel groups that are adjacent to the pixel group in the second direction and are in the same row.

8. The pixel arrangement structure according to claim 7, wherein, in two adjacent ones of the odd rows or in two adjacent ones of the even rows, an intersection point of a center connection line between two third sub-pixels in two adjacent ones of the plurality of pixel groups arranged in the second direction and the first line segment in one pixel group between the two third sub-pixels is between a center of the first line segment and the center of the second sub-pixel of the one pixel group.

9. The pixel arrangement structure according to claim 5, wherein, in the same one of the plurality of pixel groups, the closest distance between the second sub-pixel and the first sub-pixel is L1, the closest distance between the second sub-pixel and the fourth sub-pixel is L2, the closest distance between the third sub-pixel and the first sub-pixel is L3, the closest distance between the third sub-pixel and the fourth sub-pixel is L4, and L1=L2=L3=L4.

10. The pixel arrangement structure according to claim 9, wherein the closest distance between the second sub-pixel and one of the first sub-pixel and the fourth sub-pixel is L5, the closet distance between the third sub-pixel and one of the first sub-pixel and the fourth sub-pixel is L6, the second sub-pixel and the third sub-pixel are in a pixel group being adjacent to the first sub-pixel or the fourth sub-pixel in the second direction and are not in the same row with the first sub-pixel or the fourth sub-pixel, and L5=L6.

11. The pixel arrangement structure according to claim 9, wherein opposite sides of two adjacent sub-pixels are approximately parallel or have an included angle less than 45 degrees, and the adjacent sub-pixels comprise any two adjacent ones selected from the group consisting of the first sub-pixel, the second sub-pixel, the third sub-pixel, and the fourth sub-pixel.

12. The pixel arrangement structure according to claim 1, wherein the first sub-pixel and the fourth sub-pixel are sub-pixels of the same color.

13. A display substrate, comprising the pixel arrangement structure according to claim 1.

14. A display device, comprising the display substrate according to claim 13.

15. The pixel arrangement structure according to claim 1, wherein, in each of the plurality of pixel groups, a size of a gap between the first sub-pixel and the fourth sub-pixel in the second direction is larger than a length of an edge of the second sub-pixel extending along the second direction and a length of an edge of the third sub-pixel extending along the second direction, and smaller than a distance between two endpoints of the second sub-pixel in the second direction and a distance between two endpoints of the third sub-pixel in the second direction,
in the column of first sub-pixels arranged along the second direction, a size of a gap between the first sub-pixel belong to one of the plurality of pixel groups and an adjacent fourth sub-pixel belonging to another one of the plurality of pixels groups is larger than the distance between two endpoints of the second sub-pixel in the second direction and the distance between two endpoints of the third sub-pixel in the second direction.

16. The pixel arrangement structure according to claim 1, wherein, the second edge of the fourth sub-pixel has a second length, a second rectangle region having a width equal to the second length and extending along the second direction completely covers a column of fourth sub-pixels arranged along the second direction, the second rectangle region is spaced apart from the second sub-pixels of the plurality of pixel groups by at least a third spacing distance, and spaced apart from the third sub-pixels of the plurality of pixel groups by at least a fourth spacing distance, the third spacing distance and the fourth spacing distance are both greater than 0, the column of fourth sub-pixels arranged along the second direction comprises at least two fourth sub-pixels arranged along the second direction.

* * * * *